(12) United States Patent
Shirasaka et al.

(10) Patent No.: US 7,754,130 B2
(45) Date of Patent: Jul. 13, 2010

(54) METHOD FOR MANUFACTURING PHYSICAL QUANTITY SENSOR

(75) Inventors: Kenichi Shirasaka, Hamamatsu (JP); Hiroshi Saitoh, Iwata (JP)

(73) Assignee: Yamaha Corporation, Shizuoka-ken (JP)

( * ) Notice: Subject to any disclaimer, the term of this patent is extended or adjusted under 35 U.S.C. 154(b) by 395 days.

(21) Appl. No.: 11/696,949

(22) Filed: Apr. 5, 2007

(65) Prior Publication Data

US 2007/0184584 A1 Aug. 9, 2007

Related U.S. Application Data

(63) Continuation of application No. PCT/JP2005/018470, filed on Oct. 5, 2005.

(30) Foreign Application Priority Data

Oct. 8, 2004 (JP) ............................. 2004-296372
Feb. 22, 2005 (JP) ............................. 2005-045296

(51) Int. Cl.
*H01L 21/00* (2006.01)
*H01L 21/02* (2006.01)
(52) U.S. Cl. ............................. 264/272.15; 264/272.17; 264/275; 264/273; 264/294; 438/127
(58) Field of Classification Search ............ 264/272.15, 264/272.14
See application file for complete search history.

(56) References Cited

U.S. PATENT DOCUMENTS 5,176,186 A 1/1993 Bousfield et al.
6,402,009 B1 6/2002 Ishikawa
2004/0103530 A1* 6/2004 Adachi et al. ............... 29/854
2006/0211176 A1* 9/2006 Shirasaka et al. ........... 438/123

FOREIGN PATENT DOCUMENTS

| JP | 7-297335 A | 11/1995 |
|---|---|---|
| JP | 9-008195 A | 1/1997 |
| JP | 9-257511 A | 10/1997 |
| JP | 2000-243889 A | 9/2000 |
| JP | 2004-125779 A | 4/2004 |
| JP | 2004-128473 A | 4/2004 |
| JP | 2004-128474 A | 4/2004 |
| JP | 2004125779 * | 4/2004 |
| JP | 2004128474 * | 4/2004 |
| JP | 2006231536 * | 9/2006 |
| KR | 1991-7000368 | 3/1991 |

* cited by examiner

*Primary Examiner*—Joseph S Del Sole
*Assistant Examiner*—Vicki Wu
(74) *Attorney, Agent, or Firm*—Dickstein Shapiro LLP

(57) ABSTRACT

A method for manufacturing a physical quantity sensor includes the steps of: preparing a lead frame comprising a rectangular frame portion, a plurality of leads protruding out from this rectangular frame portion in the inward direction, and a stage portion that is connected to the rectangular frame portion by connecting leads; fixing a physical quantity sensor chip to the stage portion; inclining the stage portion and the physical quantity sensor chip with respect to the rectangular frame portion; and integrating the inclined physical quantity sensor chip and the leads within a metallic mold using a resin. The method further comprises the steps of providing a pressing member of a separate body to the stage portion on the back face of the stage portion in order to incline the stage portion and the physical quantity sensor chip with respect to the rectangular frame portion, and inclining the stage portion and the physical quantity sensor chip by pressing of the back face of the stage portion by the pressing member.

6 Claims, 20 Drawing Sheets

ମETHOD FOR MANUFACTURING
PHYSICAL QUANTITY SENSOR

TECHNICAL FIELD

The present invention relates to a method for manufacturing a physical quantity sensor which measures the azimuth, the direction of movement, and the like, of a magnetic field.

Priority is claimed on Japanese Patent Application No. 2004-296372 filed Oct. 8, 2004, and Japanese Patent Application No. 2005-45296 filed Feb. 22, 2005, the contents of which are incorporated herein by reference.

BACKGROUND ART

In recent years, there is an increasing demand for portable terminal devices, which are represented by mobile telephones, to be provided with a GPS (Global Positioning System) function that displays the location information of users.

In order to provide the GPS function, physical quantity sensors, such as magnetic sensors and acceleration sensors, are used in the portable terminal device. Magnetic sensors specify the location information, such as the three-dimensional azimuth and orientation of the device, by detecting the terrestrial magnetism. Acceleration sensors specify the location information by detecting the direction of movement in a position where the terrestrial magnetism cannot be detected. As these types of physical quantity sensors, there are those in which a plurality of physical quantity sensor chips (magnetic sensor chips) are arranged such that they are mutually inclined so as to miniaturize its size and reduce its thickness.

A physical quantity sensor of a configuration which inclines these physical quantity sensor chips, highly retains the sensitivity in a predetermined axis direction according to the inclination direction, and possesses an advantage in that the sensitivity in the other axis directions, including the directions along the surface of the substrate, can be decreased. It can, therefore, be thought that these physical quantity sensors will become mainstream in the future.

This type of physical quantity sensor is disclosed in Japanese Unexamined Patent Application, First Publication, No. 2004-128473. This physical quantity sensor 106 comprises, as shown in FIG. 26 and FIG. 27, two mutually inclined physical quantity sensor chips 2 and 3, and measures the orientation and magnitude of an external magnetic field. This physical quantity sensor 106 is produced using a lead frame 4 which is formed by applying a pressing process or an etching process, or both of these processes, to a metallic thin plate.

The lead frame 4 shown in FIG. 28 includes: a rectangular frame portion 5a which forms the outer rectangular frame; a plurality of leads 5b which protrude perpendicularly from the peripheral side of this rectangular frame portion 5a towards the inward direction; connecting leads 5d which extend from the end portion 5c side of the rectangular frame portion 5a towards the inward direction; and two stage portions 6 and 7 which are connected to, and supported by, these connecting leads 5d. The rectangular frame portion 5a, the leads 5b, and the connecting leads 5d are collectively referred to as the frame portion 5.

The two stage portions 6 and 7 are, as well as being formed in a rectangular shape, opposingly provided on either side of the center line of the lead frame 4, and possess a pair of protrusions 8 and 9 which protrude from the end portion 6a and 7a side towards the opposing stage portion 6 and 7 side. These protrusions 8 and 9 are formed in a thin rod shape, and are inclined on the back face 4a side of the lead frame 4.

The connecting leads 5d are suspending leads for supporting the stage portions 6 and 7 on the rectangular frame portion 5a. The one end portions 5e of the connecting leads 5d are connected to side end portions 6c and 7c, which are located on the two ends of the stage portions 6 and 7 on the one end portion 6b and 7b sides. These one end portions 5e of the connecting leads 5d on the stage portion 6 and 7 side have a concave notch provided on the side face thereof, which is formed thinner than the rest of the connecting lead 5d. This section is a twisting portion 5e, which is able to deform and twist at the time of inclining the stage portions 6 and 7.

The physical quantity sensor 106 shown in FIG. 26 and FIG. 27 includes: two physical quantity sensor chips 2 and 3 which are respectively fixed to the stage portions 6 and 7 of the abovementioned lead frame 4; metallic wires 10 for electrically connecting the physical quantity sensor chips 2 and 3 with the leads 5b; and a resin mold portion 11 which integrates the lead frame 4, the physical quantity sensor chips 2 and 3, and the leads 5b. Of the lead frame 4, sections of the leads 5b and the connecting leads 5d which protrude from the rectangular frame portion 5a and the resin mold portion 11 to the outside are cut off after resin formation.

The resin mold portion 11 represents the section enclosed by the two-dot and dashed lines shown from FIG. 26 to FIG. 28, and the side cross-section is formed to an approximate trapezoid shape. Within this resin mold portion 11, the end portions 8a and 9a of the protrusions 8 and 9 abut on a horizontal plane which is continuous with the back faces 4a of the leads 5b, and as a result, the stage portions 6 and 7 and the physical quantity sensor chips 2 and 3 are fixed by the resin in a state where they are inclined.

Next, a method for manufacturing this physical quantity sensor 106 is explained with reference to FIG. 28 and FIGS. 29A-29C.

Firstly, as shown in FIG. 28 and FIG. 29A, as a result of a photoetching process, the section further on the inside than the metallic thin plate stage portions 6 and 7, which include the leads 5b, is formed thinner than the other sections of the lead frame 4, and is, for example, formed to half the thickness. By applying a pressing process or an etching process, or both of these processes, a lead frame 4 in which the stage portions 6 and 7 are supported by the rectangular frame portion 5a as a result of the connecting leads 5d, is formed. At this time, as well as the leads 5b being formed on the lead frame 4, the twisting portions 5e are formed on the connecting lead 5d. Furthermore, the protrusions 8 and 9 are processed such that they are inclined with respect to the rectangular frame portion 5a.

Next, as well as bonding the physical quantity sensor chips 2 and 3 to the surfaces 6d and 7d of the stage portions 6 and 7, the physical quantity sensor chips 2 and 3 are electrically connected to the leads 5b by the wires 10.

In the stage mentioned below, in which the stage portions 6 and 7 are inclined, since the bonding sections 10a of the physical quantity sensor chips 2 and 3, and the bonding sections 10b of the leads 5b become mutually separated, the wires 10 can be installed to the bonding sections 10a and 10b in a state where there is a surplus provided to the length or the height thereof.

Next, as shown in FIG. 29B, of the frame portion 5, a section excluding portions of the lead 5b and the connecting leads 5d, and the rectangular frame portion 5a, is sandwiched into the metallic molds D and E. These metallic molds D and E are used for forming the resin mold portion 11, which is for embeddingly fixing the physical quantity sensor chips 2 and 3 in the interior of the resin.

When the metallic molds D and E, which sandwich the frame portion 5 are clamped, the end portions 8a and 9a of the protrusions 8 and 9 are pressed by the inner face E1 of the metallic mold E. As a result of this force, the twisting portions 5e, which are located on the side end portions 6c and 7c of the stage portions 6 and 7, are twisted and deformed, and the stage portions 6 and 7 are respectively rotationally moved about an axis which connects the two twisting portions 5e. As a result, the stage portions 6 and 7, and the physical quantity sensor chips 2 and 3 are, as shown in FIG. 29C, inclined at a fixed angle with respect to rectangular frame portion 5a and the leads 5b.

Thereafter, in a state where the inner face E1 of the metallic mold E is pressing the end portions 8a and 9a of the protrusions 8 and 9, the resin mold portion 11 is formed by injecting a melted resin into the metallic molds D and E, and embedding the physical quantity sensor chips 2 and 3 into the interior of the resin. As a result, the physical quantity sensor chips 2 and 3 are fixed within the resin mold portion 11 in a state where they are mutually inclined.

Lastly, the sections of the leads 5b and the connecting leads 5d which protrude outside the rectangular frame portion 5a and the resin mold portion 11, which is represented by two dot chain lines from FIG. 26 to FIG. 28, are cut off, and the production of the physical quantity sensor 106 is completed.

However, in this production method of the physical quantity sensor, since the protrusions are formed inclined with respect to the rectangular frame portion at the time of processing the lead frame, there was a tendency for the accuracy of the inclining process of these protrusions to deviate, and there were cases where the predetermined inclination angle could not be accurately secured. Furthermore, even if they were at a predetermined inclination angle at the time of processing, there were cases where a force attempting to return to the original position acted on the inclined protrusions thereafter, and deviations in the predetermined inclination angle occurred with time.

Furthermore, since the inclination angle of the stage portions before the resin mold portion is formed is maintained by thin rod-shaped protrusions abutting the inner face of the metallic mold, there were cases where when resin was injected into the metallic mold, the protrusions were displaced as a result of this injection, and distortions in the stage portion occurred. In the above cases, there was a problem in that the physical quantity sensor chip could not be accurately installed at a predetermined inclination angle.

DISCLOSURE OF INVENTION

The present invention takes into consideration the above-mentioned circumstances, with an object in providing a production method of a physical quantity sensor which can accurately install a physical quantity sensor chip at a predetermined inclination angle by inclining the stage portion and the physical quantity sensor chip by means of a pressing member provided on a separate body to the stage portion.

In order to achieve the above-mentioned object, a method for manufacturing a physical quantity sensor of this invention comprises the steps of: preparing a lead frame which includes a rectangular frame portion, a plurality of leads protruding out from this rectangular frame portion in the inward direction, and a stage portion that is connected to the rectangular frame portion by connecting leads; fixing a physical quantity sensor chip to the stage portion of the lead frame; inclining the stage portion and the physical quantity sensor chip with respect to the rectangular frame portion; and integrating the inclined physical quantity sensor chip and the leads within a metallic mold using a resin, the step of inclining the stage portion and the physical quantity sensor chip further including the steps of providing a pressing member of a separate body to the stage portion on the back face of the stage portion in order to incline the stage portion and the physical quantity sensor chip with respect to the rectangular frame portion, and inclining the stage portion and the physical quantity sensor chip by pressing of the back face of the stage portion by the pressing member.

In the production method of a physical quantity sensor according to this invention, the pressing member is provided on the back face of the stage portion, and the stage portion is inclined by pressing of the back face of the stage portion by this pressing member. Accordingly, the stage portion and the physical quantity sensor chip can be inclined with certainty. Furthermore, since the stage portion is maintained with certainty by the pressing member when the resin is injected into the metallic mold, distortion and displacement of the stage portion resulting from the injection of the resin does not occur, and the stage portion can be fixed at a predetermined inclination angle.

The production method of the present invention may comprise installing the pressing member on the inner face of the metallic mold and the back face of the stage portion, and clamping the metallic mold so that the pressing member presses the back face of the stage portion. Furthermore, the pressing member may be integrated together with the physical quantity sensor chip and the leads by the resin within the metallic mold.

According to this production method, the stage portion can be inclined as a result of pressing by the pressing member at the time of tightening the metallic mold.

In the production method of the present invention, the pressing member may be a jig which is movably provided in an aperture portion of the metallic mold, and after tightening of the metallic mold, the back face of the stage portion is pressed by the jig. In this case, the physical quantity sensor chip and the leads are integrated by the resin in a state where the inclination is maintained by the jig.

According to this production method, as well as the stage portion being able to be appropriately inclined by the simple operation of inserting the jig from the aperture portion of the metallic mold by a fixed amount, the stage portion is maintained with certainty by the jig when the resin is injected into the metallic mold. Consequently, distortion and displacement of the stage portion resulting from the injection of the resin does not occur, and the stage portion can be fixed at a predetermined inclination angle.

The production method of the present invention is able to incline the stage portion and the physical quantity sensor chip with certainty as a result of the pressing member provided as a separate body to the stage portion on the back face of the stage portion. Furthermore, since the stage portion is maintained with certainty by the pressing member when the resin is injected into the metallic mold, distortion and displacement of the stage portion resulting from the injection of the resin does not occur, and the stage portion and the physical quantity sensor chip can be installed with an accurate inclination angle.

BEST MODE FOR CARRYING OUT THE INVENTION

First Embodiment

Hereunder, a first embodiment of this invention is explained with reference to FIG. 1 to FIG. 5. In the explanation of the present embodiment, the same reference symbols are given to constituents common with the physical quantity sensor shown from FIG. 26 to FIG. 29, and explanation regarding the details is omitted.

Figure 1:
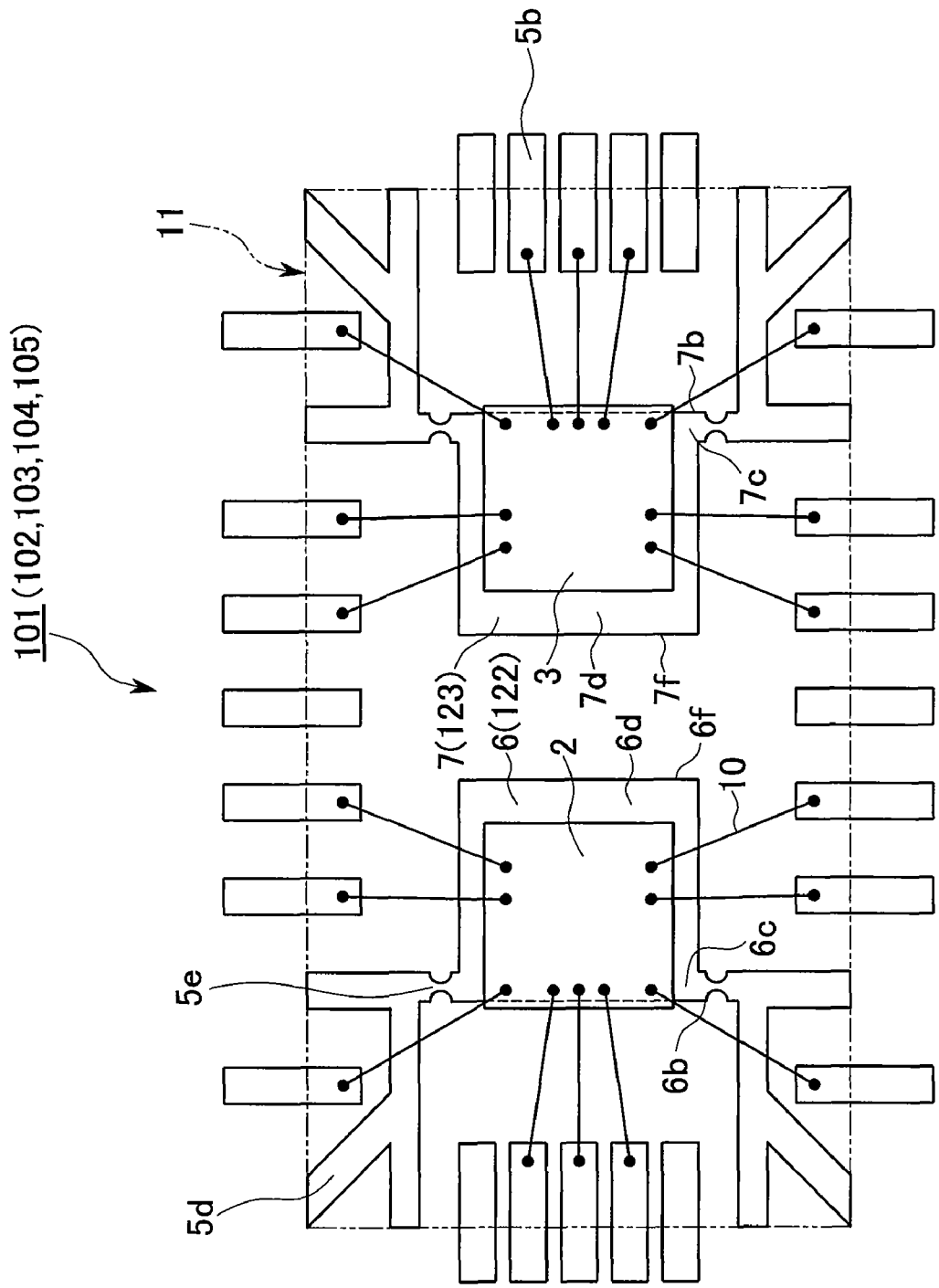
FIG. 1 is a plan view showing one example of a physical quantity sensor produced by the production method according to the present invention.

The physical quantity sensor 101 shown in FIG. 1 is one which measures the orientation and magnitude of an external magnetic field by possessing two mutually inclined physical quantity sensor chips 2 and 3, and is produced using a lead frame 4.

Figure 2:
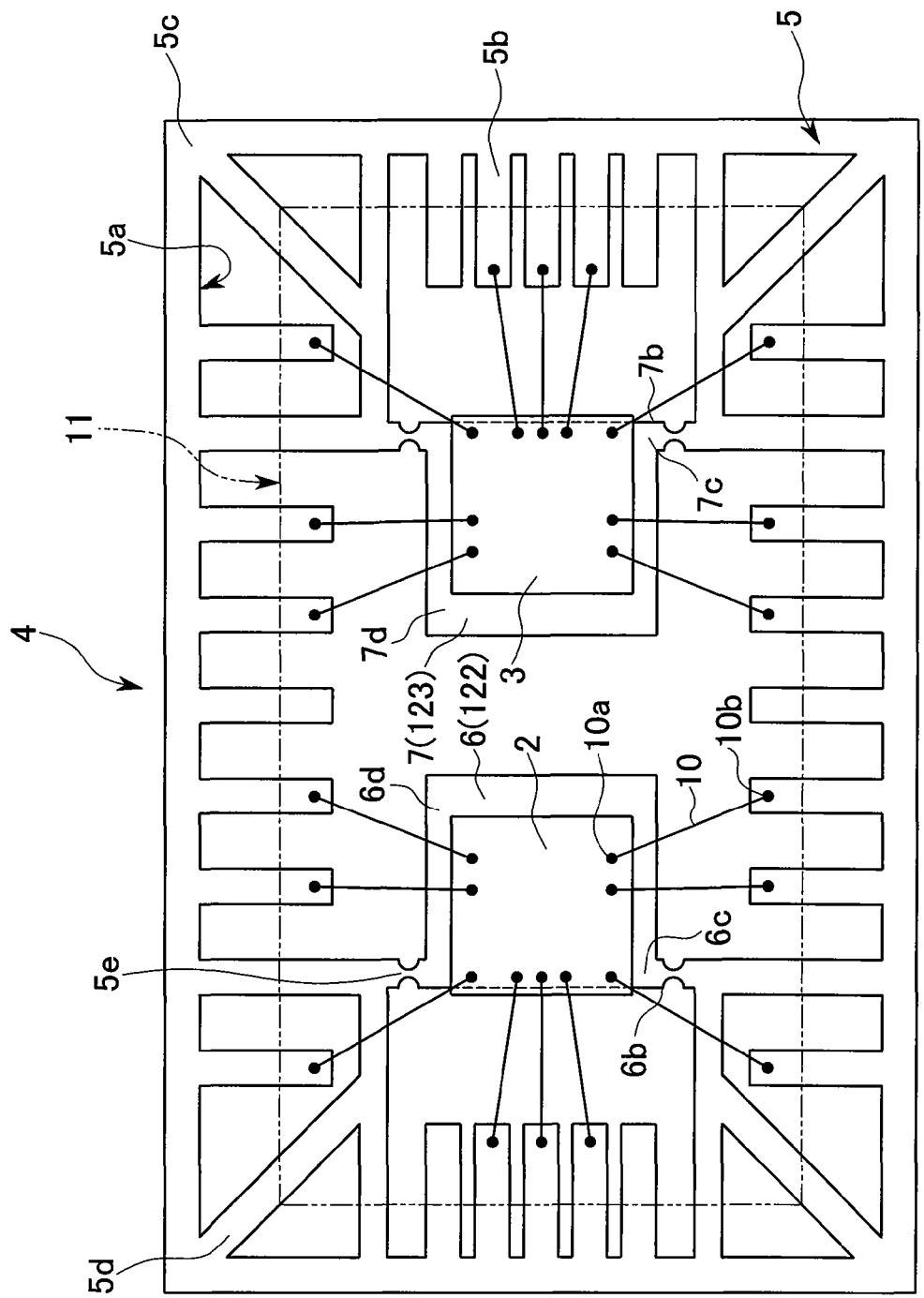
FIG. 2 is a plan view showing a state where a physical quantity sensor chip has been installed on a lead frame in the production process of the physical quantity sensor shown in FIG. 1.

As shown in FIG. 2, as well as the two stage portions 6 and 7 being formed in a rectangular shape, they are opposingly provided on either side of the central line of the lead frame 4. It differs from the magnetic sensor shown in FIG. 26 to FIG. 29 in the point that the protrusions 8 and 9 are not formed.

Figure 5:
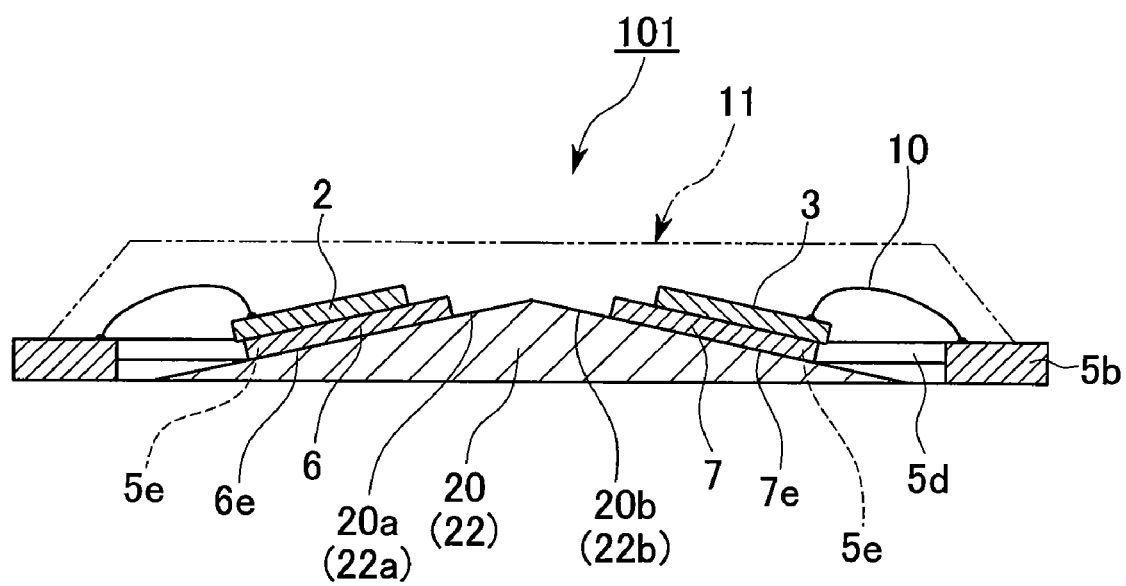
FIG. 5 is a side cross-sectional view showing a physical quantity sensor produced by the production method according to the first and the third embodiment of the present invention.

As shown in FIG. 5, the physical quantity sensor 101 produced by the production method of the first embodiment comprises the lead frame 4, two tabular physical quantity sensor chips 2 and 3 which are respectively fixed to the stage portions 6 and 7, metallic wires 10 for electrically connecting the physical quantity sensor chips 2 and 3 and the leads 5b, and a resin mold portion 11 which integrates the physical quantity sensor chips 2 and 3 and the leads 5b by means of resin. Of the lead frame 4 shown in FIG. 2, the sections of the leads 5b and the connecting leads 5d which are located on the outside of the resin mold portion 11 are cut off together with the rectangular frame portion 5a.

The resin mold portion 11 is the section enclosed by the two dot chain lines shown in FIG. 1, FIG. 2, and FIG. 5, and the side cross-section is formed in a near trapezoid shape. The pressing member 20, comprising the inclined surfaces 20a and 20b which make facial contact with the plane formed by the back faces 6e and 7e of the inclined stage portions 6 and 7, is also integrated within the resin mold portion 11. This pressing member 20 is one formed by a metal, and the side cross-section is a triangular shape. The inclined surfaces 20a and 20b of the pressing member 20 possesses the same inclination angle as the angle to which the respective stage portions 6 and 7 should be inclined.

Next, the production method of this physical quantity sensor 101 is explained.

Figure 28:
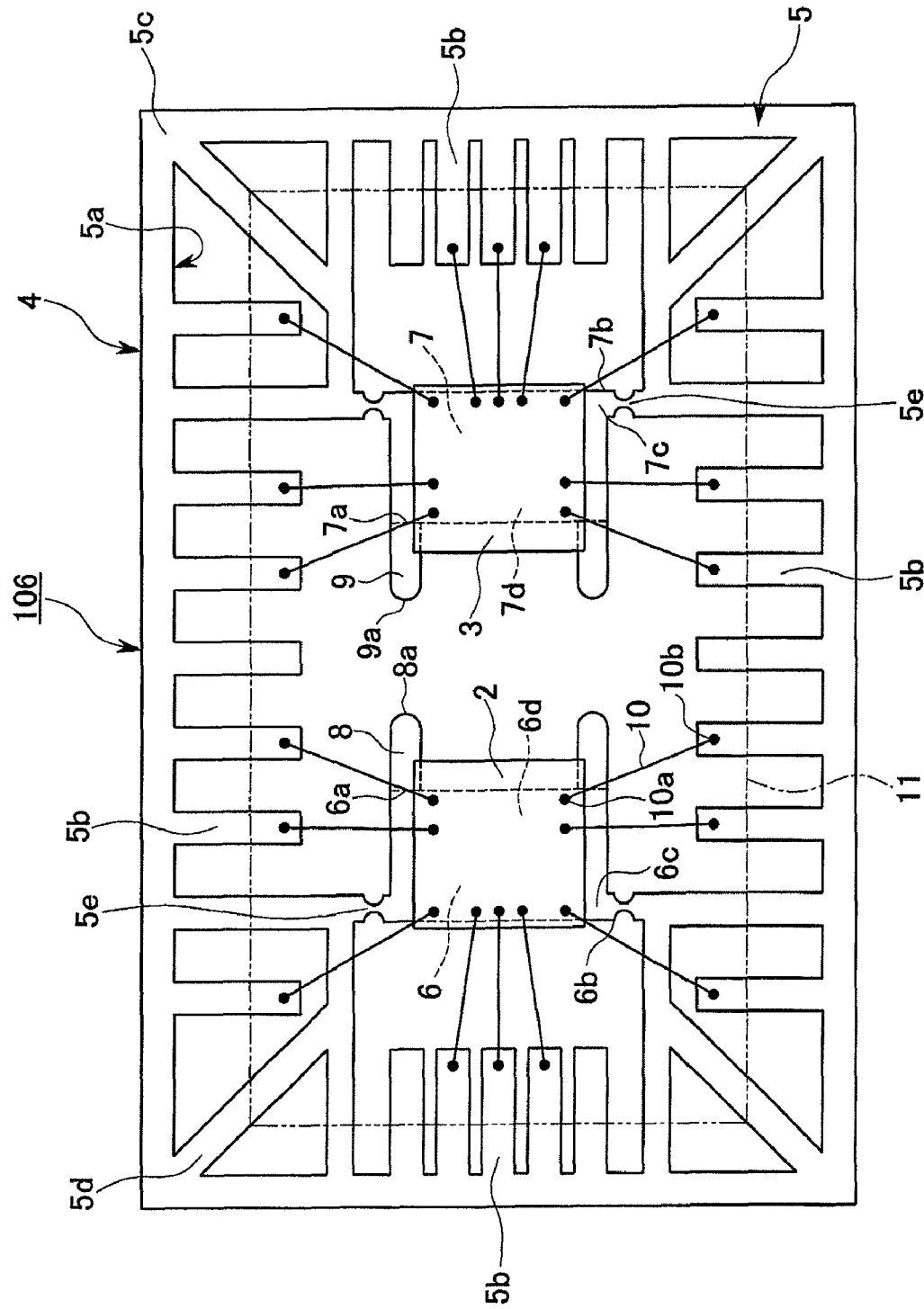
FIG. 28 is a plan view showing a state where the physical quantity sensor chip has been installed on a lead frame, in the conventional production process of the physical quantity sensor shown in FIG. 26.
Figure 29A:
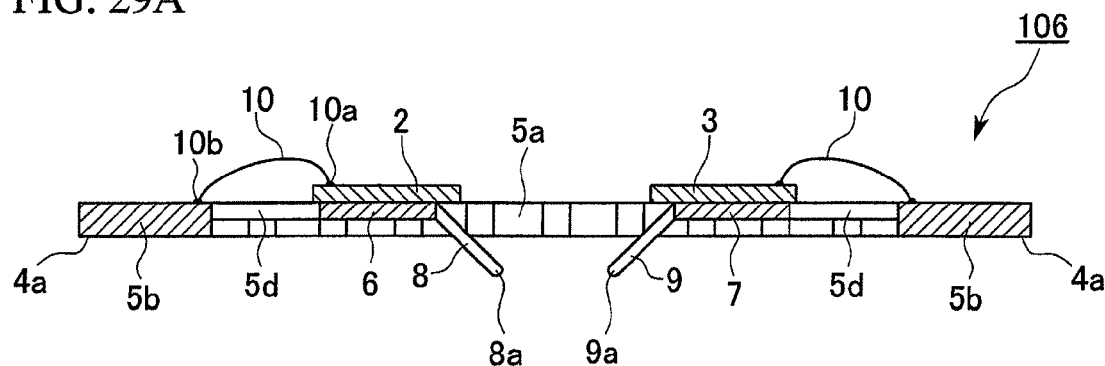
FIG. 29A is a side cross-sectional view showing a method of inclining the stage portion and the physical quantity sensor chip, in the conventional production method of the physical quantity sensor.
Figure 29B:
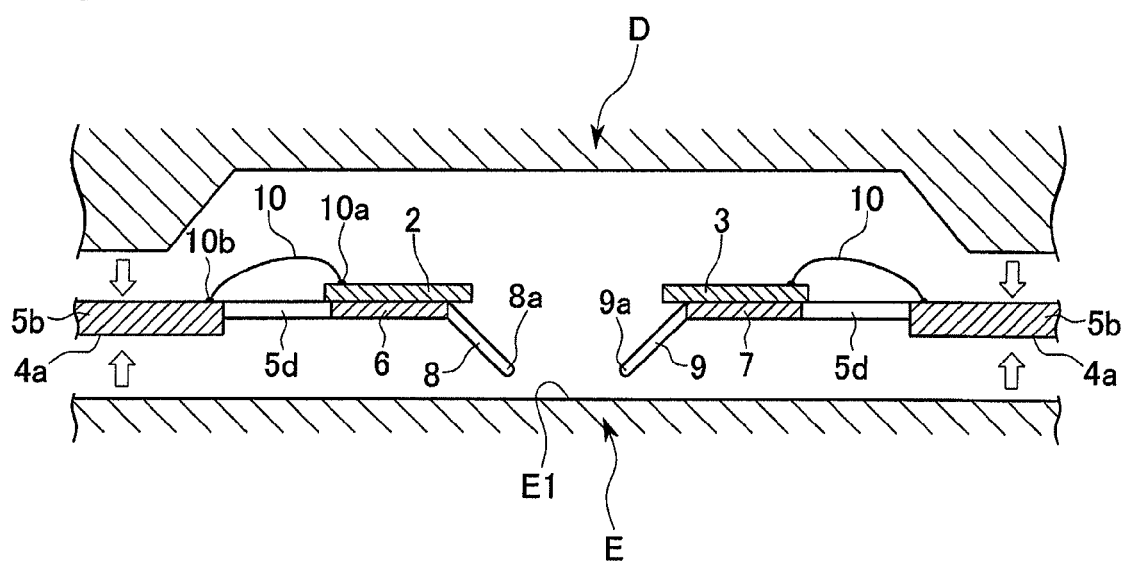
FIG. 29B is a side cross-sectional view showing a method of inclining the stage portion and the physical quantity sensor chip, in the conventional production method of the physical quantity sensor.
Figure 29C:
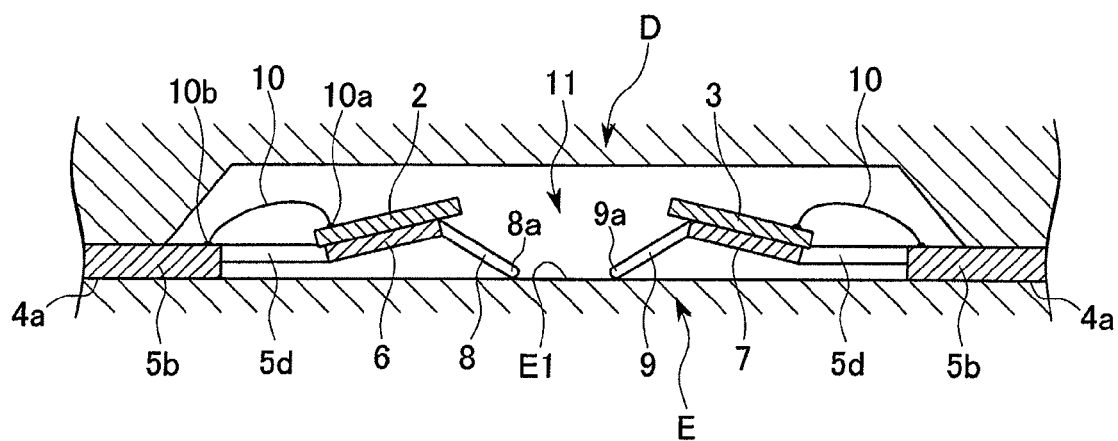
FIG. 29C is a side cross-sectional view showing a method of inclining the stage portion and the physical quantity sensor chip, in the conventional production method of the physical quantity sensor.

The lead frame 4 shown in FIG. 2, is produced in the same manner as the conventional lead frame shown in FIG. 28, except that the protrusions 8 and 9 are not provided. The physical quantity sensor chips 2 and 3 are bonded to the respective surfaces 6d and 7d of the stage portions 6 and 7. These physical quantity sensor chips 2 and 3 are electrically connected by the wires 10.

Figure 3:
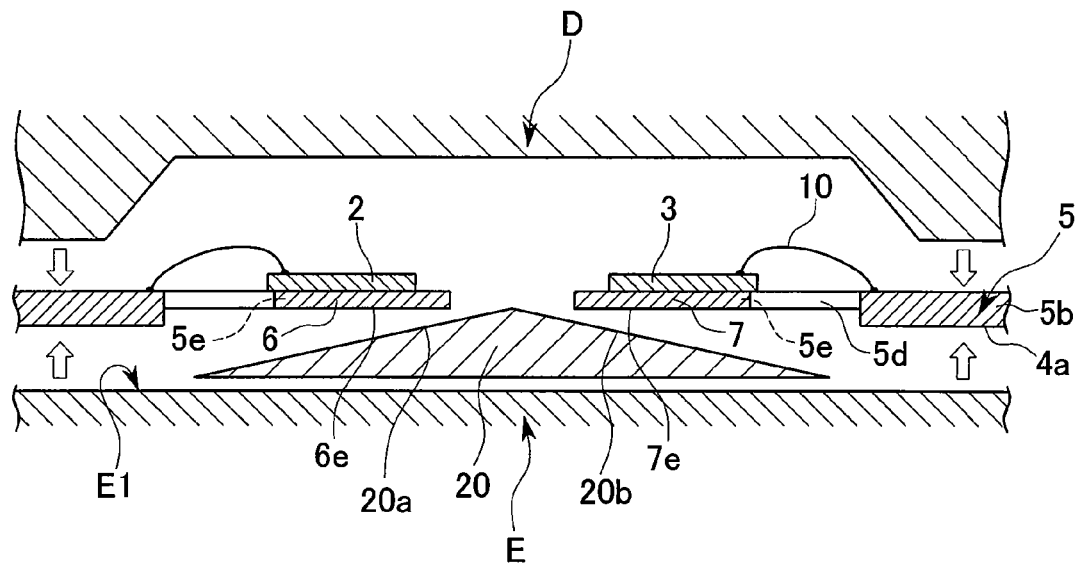
FIG. 3 is a side cross-sectional view showing a method of inclining the stage portion and the physical quantity sensor chip of the physical quantity sensor shown in FIG. 1, in a production method of a physical quantity sensor, according to a first embodiment of the present invention.
Figure 4:
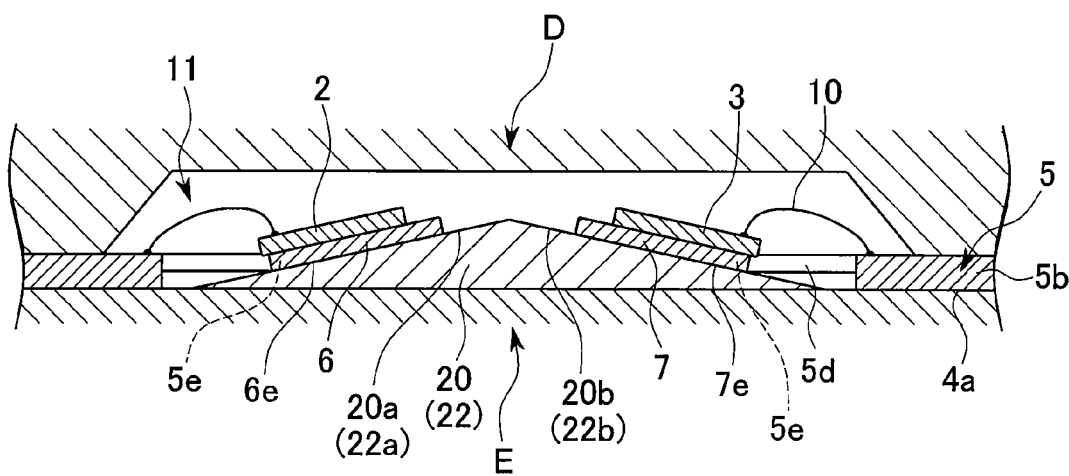
FIG. 4 is a side cross-sectional view showing a method of inclining the stage portion and the physical quantity sensor chip of the physical quantity sensor shown in FIG. 1, in the production method of a physical quantity sensor, according to the first and a third embodiments of the present invention.

Next, as shown in FIG. 3 and FIG. 4, of the frame portion 5, the rectangular frame portion 5a and the rectangular frame portion 5a proximal section of the leads 5b are fixed and sandwiched by the metallic molds D and E. The metallic molds D and E are used in order to encapsulate and fix the physical quantity sensor chips 2 and 3 in the resin.

The pressing member 20, which is a separate body isolated to the stage portions 6 and 7, is installed between the stage portions 6 and 7 and the inner face E1 of the metallic mold E. This pressing member 20 moves in the direction of the arrows of the metallic molds D and E when the metallic molds D and E are clamped, as well as pressing the back faces 6e and 7e of the stage portions 6 and 7 as a result of the inclined surfaces 20a and 20b thereof. As a result, a twisting deformation is generated at the twisting portion 5e of the connecting leads 5d, inclining the stage portions 6 and 7. When the stage portions 6 and 7 are inclined at a predetermined inclination angle, the inclined plane formed by the back faces 6e and 7e of the stage portions 6 and 7, and the inclined surfaces 20a and 20b of the pressing member 20 come into facial contact.

As shown in FIG. 4, at the point when the clamping of the metallic molds D and E has been completed, the inclined stage portions 6 and 7 are maintained at a predetermined inclination angle as a result of the pressing member 20 coming into facial contact with the back faces 6e and 7e of the inclined stage portions 6 and 7.

In this state, the melted resin is injected into the interior of the metallic molds D and E, the physical quantity sensor chips 2 and 3 is embedded in the interior of the resin, and the resin mold portion 11 is formed. As a result, the physical quantity sensor chips 2 and 3 are fixed within the resin mold portion 11 in a state where they are mutually inclined. The pressing member 20 is also integrated in the resin mold portion 11, and is fixed.

Next, as shown in FIG. 5, after solidification of the resin and formation of the resin mold portion 11, the metallic molds D and E are removed, and finally, of the rectangular frame portion 5a and leads 5b, sections which protrude outside the resin mold portion 11 are cut off, and the production of the physical quantity sensor 101 is completed.

In the production method of the physical quantity sensor 101, by performing the clamping of the metallic molds D and E in a state where the pressing member 20 has been separatively located between the stage portions 6 and 7 and the inner face E1 of the metallic mold E, the pressing member 20 presses the back faces 6e and 7e of the stage portions 6 and 7 with certainty, and as a result, the stage portions 6 and 7 can be inclined at a predetermined inclination angle with certainty.

Furthermore, in the production method of the physical quantity sensor 101, the pressing member 20 comprises the inclined surfaces 20a and 20b which make facial contact with the back faces 6e and 7e of the inclined stage portions 6 and 7. Accordingly, when the resin is injected into the metallic molds D and E, the stage portions 6 and 7 are maintained with certainty by this pressing member 20, and the stage portions 6 and 7 can be fixed at a predetermined inclination angle without distortion or displacement occurring as a result of the injection of the resin.

Moreover, in the production method of the physical quantity sensor 101, the pressing member 20 is formed by a metal, and this pressing member 20 is integrated within the resin mold portion 11. Accordingly, it also possesses an advantage in being able to improve the heat dissipation efficiency of the physical quantity sensor 101. The pressing member 20 is, for example, formed from copper or brass.

Although the side cross-section of the pressing member 20 was made to be one representing a triangular shape, it not necessarily restricted to this. That is, it is acceptable as long as it possesses at least the inclined surfaces 20a and 20b which make facial contact with the back faces 6e and 7e of the inclined stage portions 6 and 7 in one part.

Furthermore, although the pressing member 20 was made to be one formed by a metal, it is not necessarily restricted to this. There are no particular restrictions on the material of the pressing member 20. In the case where the pressing member 20 is formed by, for example, a resin, by using a resin mixed with a high heat dissipating resin or a metal, the heat dissipation efficiency of the physical quantity sensor 101 can be improved. Furthermore, in the case where there is no necessity to improve the heat dissipation efficiency of the physical quantity sensor 101, the pressing member 20 can, for example, be formed by the same resin as the resin mold portion 11, and there are also no particular restrictions on the material of the resin.

Furthermore, although it was made such that the pressing member 20 presses and inclines the stage portions 6 and 7 at the time of clamping the metallic molds D and E, it is not necessarily restricted to this. That is, it is acceptable for the stage portions 6 and 7 to be pressed and inclined with the pressing member 20 before clamping the metallic molds D and E, fixing the pressing member 20 in this state to the stage portions 6 and 7 by an appropriate measure, and integrating thereafter by performing clamping of the metallic molds D and E and injecting the resin into the metallic mold D and E.

The production method of the first embodiment mentioned above may be applied to physical quantity sensors other than the ones shown in FIG. 1 and FIG. 2, in which the twisting portions 5e are formed on the connecting leads 5d in order to incline the stage portions 6 and 7. For example, this production method may, as shown in FIG. 6 and FIG. 7, be applied to a physical quantity sensor in which the bending portion 5f, which can be deformed and bent, is formed on the connecting leads 5d in order to incline the stage portions 6 and 7.

Figure 6:
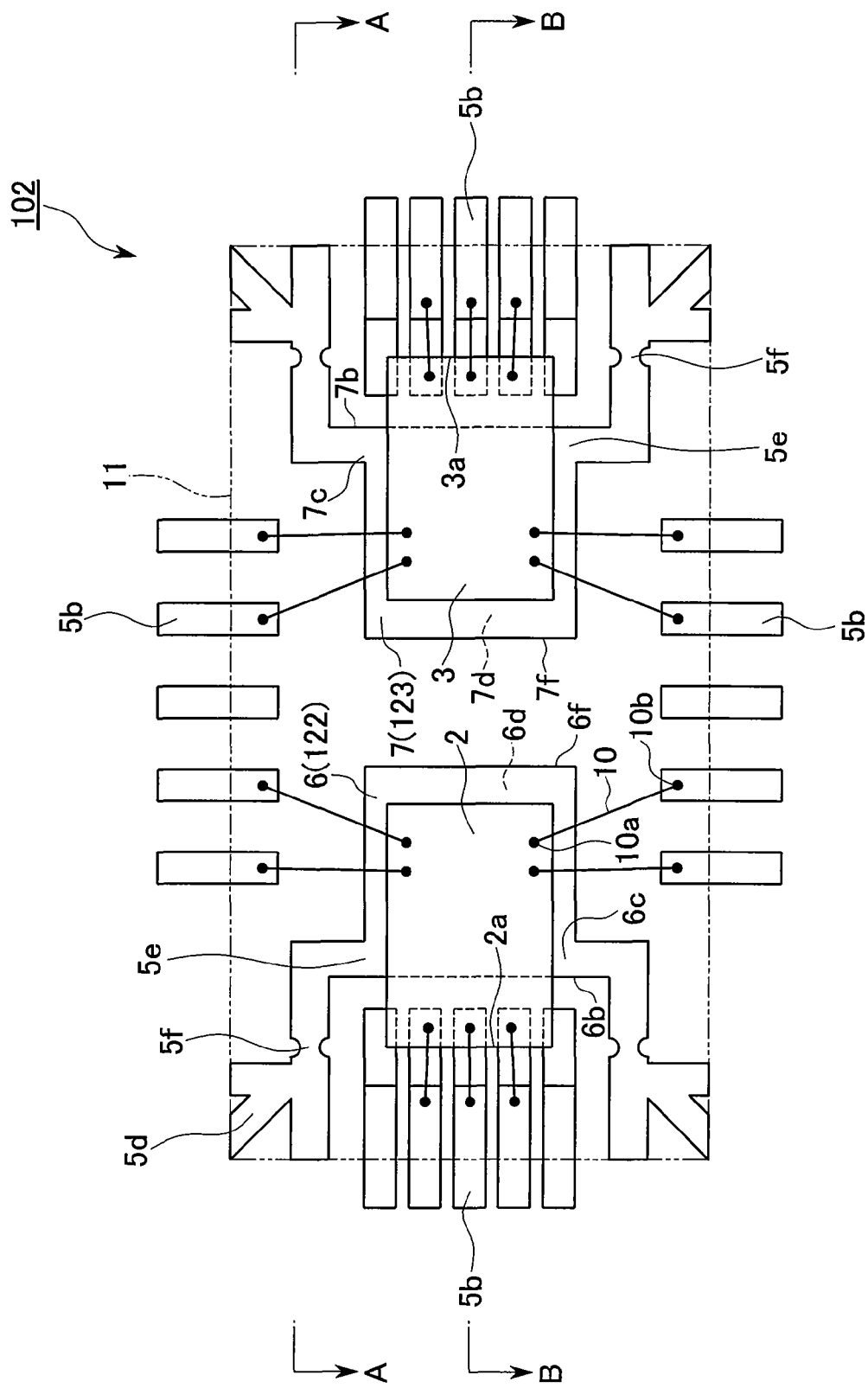
FIG. 6 is a plan view showing an alternative example of a physical quantity sensor produced by the production method of the present invention.
Figure 7:
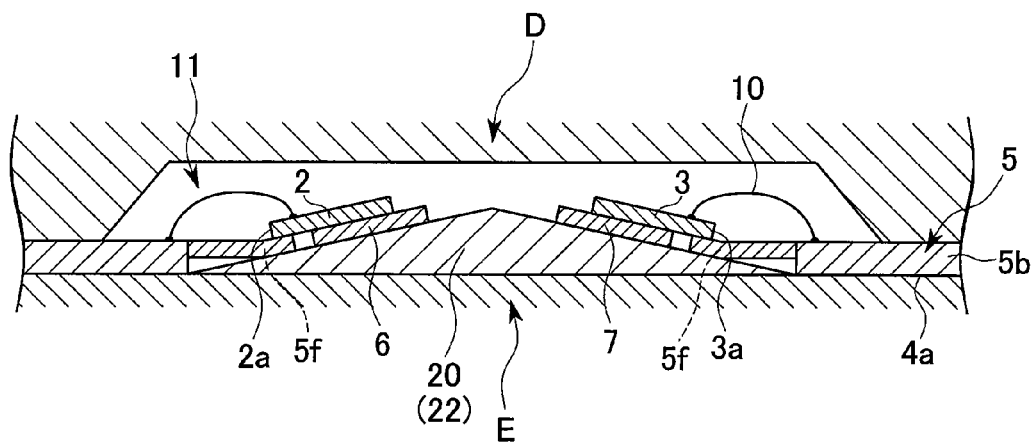
FIG. 7 is a side cross-sectional view showing a method of inclining the stage portion and the physical quantity sensor chip of the physical quantity sensor shown in FIG. 6, in the production method according to the first embodiment of the present invention.

In the physical quantity sensor 102 shown in FIG. 6 and FIG. 7, the physical quantity sensor chips 2 and 3, which are fixed on the stage portions 6 and 7, have the one end portions 2a and 3a thereof also fixed to the leads 5b. The inside sections of the leads 5b to which these physical quantity sensor chips 2 and 3 are fixed are, for example, thinly formed to half the thickness. It is acceptable for the inside sections of these leads 5b and the physical quantity sensor chips 2 and 3 to not be fixed, and for the leads 5b to only support the physical quantity sensor chips 2 and 3. It is acceptable if, at the very least, the leads 5b have a location relationship such that they are parallel to the bottom faces of the one end portions 2a and 3a of the physical quantity sensor chips 2 and 3.

In such a physical quantity sensor 102, as shown in FIG. 7, the bending portions 5f provided on the connecting leads 5d bend as a result of the pressing member 20 pressing the stage portions 6 and 7, and as well as this, the thinly formed inside sections of the leads 5b bend, inclining the stage portions 6 and 7.

That is to say, the inclining of the stage portions 6 and 7 resulting from the pressing of the pressing member 20 is achieved by the bending deformations of the connecting leads 5d and the leads 5b.

Second Embodiment

Next, the production method according to a second embodiment of this invention is explained with reference to FIG. 1, FIG. 2, and FIG. 8 to FIG. 10. In the explanation of the present embodiment, the same reference symbols are given to constituents common with the first embodiment, and explanation regarding the details is omitted.

The physical quantity sensor 103 produced by the second embodiment is, in the same manner as the physical quantity sensor shown in FIG. 1, one which measures the orientation and magnitude of an external magnetic field as a result of two mutually inclined physical quantity sensor chips 2 and 3, and is produced using the lead frame 4 shown in FIG. 2.

Figure 10:
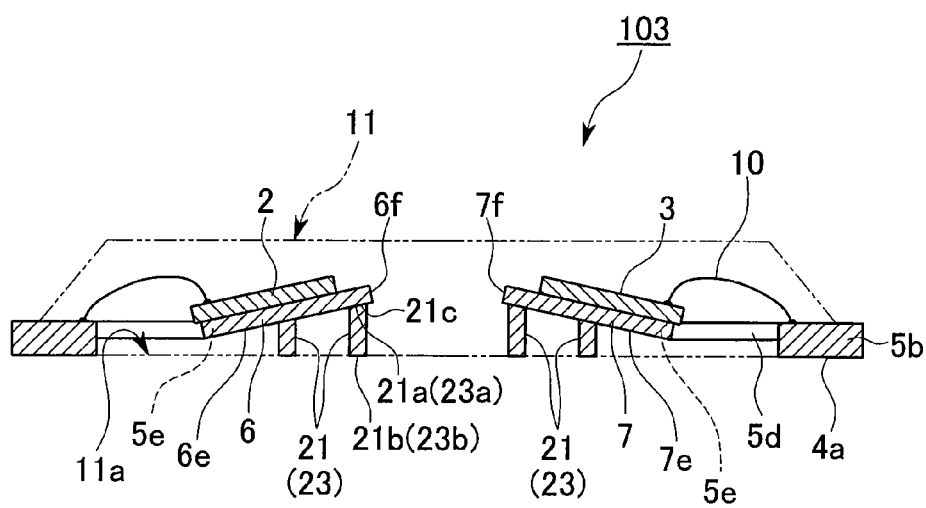
FIG. 10 is a side cross-sectional view showing a physical quantity sensor produced by the production method according to the second embodiment and a fourth embodiment of the present invention.

As shown in FIG. 10, the physical quantity sensor 103 produced by the second embodiment comprises the lead frame 4, two tabular physical quantity sensor chips 2 and 3 of a plan view rectangular shape which are respectively fixed on the stage portions 6 and 7, the metallic wires 10 for electrically connecting the physical quantity sensor chips 2 and 3 and the leads 5b, and the resin mold portion 11 which integrates the physical quantity sensor chips 2 and 3 and the leads 5b as a result of the resin. Of the lead frame 4, sections of the leads 5b and the connecting leads 5d which protrude from the resin mold portion 11 to the outside are cut off together with the rectangular frame portion 5a.

The resin mold portion 11 is the section enclosed by the two dot chain lines in FIG. 1, FIG. 2 and FIG. 10, and the side cross-section is formed in a near trapezoid shape. A plurality of pin-shaped pressing members 21 are also integrated within the resin mold portion 11, between the inclined stage portions 6 and 7 and the bottom face 11a of the resin mold portion 11 which is continuous with the back faces 4a of the leads 5b. These pin-shaped pressing members 21 are formed by a metal, and are provided on the underside of the stage portions 6 and 7. The plurality of pin-shaped pressing members 21 are positioned on a straight line parallel with the straight line which connects the twisting portion 5e of the stage portions 6 and 7, at appropriate intervals. The locations at which the pressing members 21 are positioned are the end portions 6f and 7f of the stage portions 6 and 7 and the center portions of the stage portions 6 and 7 in FIG. 10. The pin-shaped pressing members 21 abut the back faces 6e and 7e of the stage portions 6 and 7 through the one end portions 21a, and the other end portions 21b are positioned on the bottom face 11a of the resin mold portion 11.

The one end portions 21a of the pin-shaped pressing members 21 possess a flat surface 21c which connect with the back faces 6e and 7e of the inclined stage portions 6 and 7.

Next, the production method of this physical quantity sensor 103 is explained.

The lead frame 4 is, as shown in FIG. 2, produced in the same manner as the one shown in the first embodiment.

Figure 8:
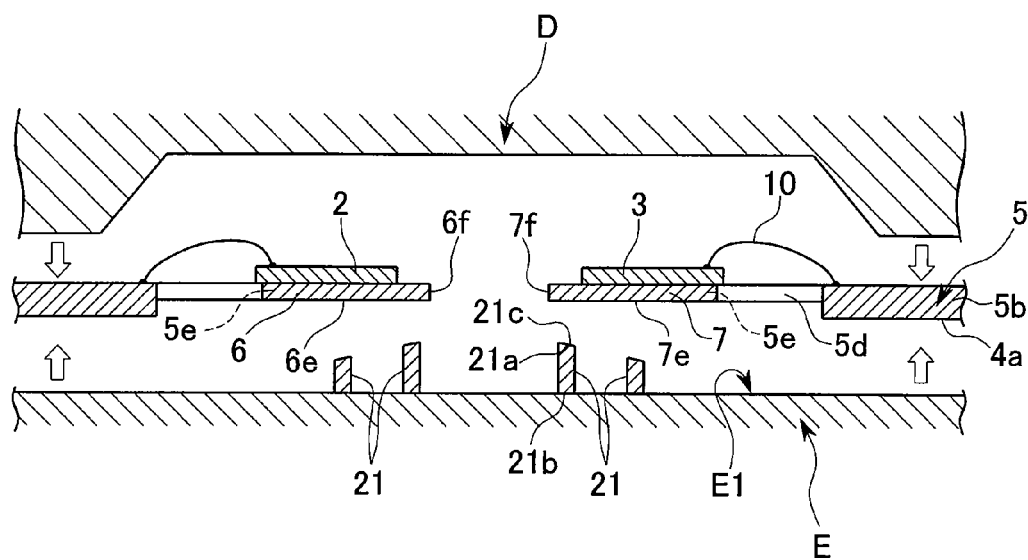
FIG. 8, a side cross-sectional view showing a method of inclining the stage portion and the physical quantity sensor chip of the physical quantity sensor shown in FIG. 1, in a production method of a physical quantity sensor, according to a second embodiment of the present invention.
Figure 9:
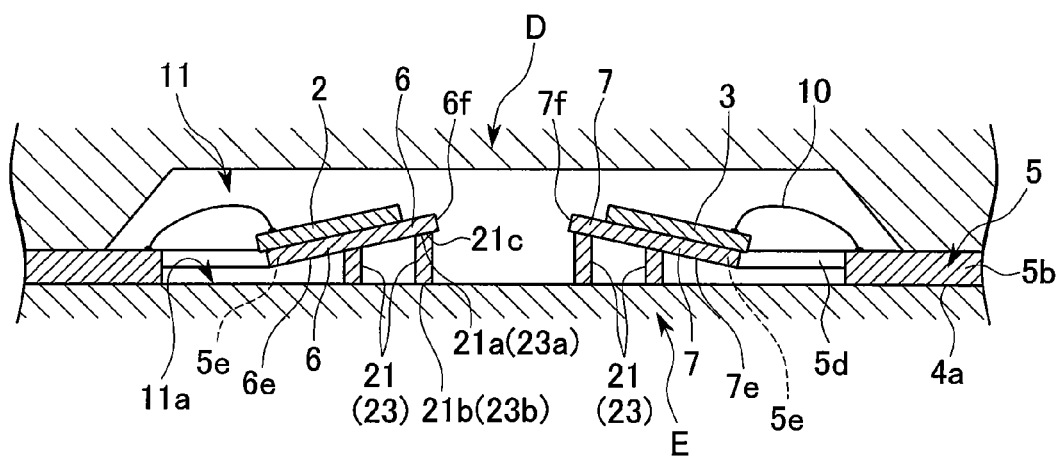
FIG. 9 is a side cross-sectional view showing a method of inclining the stage portion and the physical quantity sensor chip of the physical quantity sensor shown in FIG. 1, in the production method of a physical quantity sensor, according to the second embodiment of the present invention.

Next, as shown in FIG. 8 and FIG. 9, of the frame portion 5, the rectangular frame portion 5a and the rectangular frame portion 5a proximal section of the leads 5b are fixed by sandwiching with the metallic molds D and E. The metallic molds D and E are used in order to encapsulate and fix the physical quantity sensor chips 2 and 3 in the resin.

The plurality of pin-shaped pressing members 21, which are separate bodies isolated to the stage portions 6 and 7, are installed between the stage portions 6 and 7 and the inner face E1 of the metallic mold E by an appropriate measure. These pressing members 21 move in the direction of the arrows of the metallic molds D and E when the metallic molds D and E are clamped, as well as pressing the back faces 6e and 7e of the stage portions 6 and 7 as a result of the inclined surfaces 20a and 20b thereof. As a result, twisting deformation is generated in the twisting portions 5e of the connecting leads 5d, and the stage portions 6 and 7 are inclined at a predetermined inclination angle. At this time, the back faces 6e and 7e of the stage portions 6 and 7 and the flat surfaces 21c formed on the one end portions 21a of the pin-shaped pressing members 21 become engaged.

As shown in FIG. 9, at the point of completion of the clamping of the metallic molds D and E, the pin-shaped pressing members 21 maintain the inclined stage portions 6 and 7 at a predetermined inclination angle.

In this state, the melted resin is injected into the metallic molds D and E, the physical quantity sensor chips 2 and 3 are embedded in the interior of the resin, and the resin mold portion 11 is formed. As a result, as shown in FIG. 10, the physical quantity sensor chips 2 and 3 are fixed within the resin mold portion 11 in a state where they are mutually inclined. The pin-shaped pressing members 21 are also integrated in the resin mold portion 11, and are fixed.

Next, as shown in FIG. 10, after solidification of the resin and formation of the resin mold portion 11, the metallic molds D and E are removed. Lastly, of the leads 5b, sections which protrude outside the resin mold portion 11 are cut off together with the rectangular frame portion 5a, and the production of the physical quantity sensor 103 is completed.

In the production method of the physical quantity sensor 103 mentioned above, the pressing members 21, which are provided upright by an appropriate means between the stage portions 6 and 7 and the inner face E1 of the metallic mold E, press the back faces 6e and 7e of the stage portions 6 and 7 as a result of performing clamping of the metallic molds D and E. Accordingly, the stage portions 6 and 7 can be inclined with certainty at a predetermined inclination angle.

Furthermore, in the production method of the physical quantity sensor 103 mentioned above, the inclined stage portions 6 and 7 are maintained by the pin-shaped pressing members 21. Accordingly, when the resin is injected into the metallic molds D and E, the stage portions 6 and 7 are maintained with certainty, and the stage portions 6 and 7 can be made a predetermined inclination angle without distortion and displacement occurring as a result of the injection of the resin.

Moreover, in the production method of the physical quantity sensor 103 mentioned above, the pressing members 21 are formed by a metal, and these pressing members 21 are integrated within the resin mold portion 11. Accordingly, it also possesses an advantage in being able to improve the heat dissipation efficiency of the physical quantity sensor 103. The pressing member 20, for example, comprises copper or brass, and possesses a length which forms the predetermined inclination angle.

The pin-shaped pressing member 21 may be made the same material as the pressing member 20 used in the first embodiment. Furthermore, the pin-shaped pressing members 21 may be positioned anywhere, as long as it is possible to press the back faces 6e and 7e of the stage portions 6 and 7 with certainty.

Furthermore, although the one end portions 21a of the pin-shaped pressing members 21 were made to possess the flat surfaces 21c, it is not necessarily restricted to this. That is, the shape of the one end portions 21a of the pin-shaped pressing members 21 may be, for example, a spherical shape, a hemispherical shape or a pointed shape, and there are no particular restrictions on the shape.

The production method of the second embodiment mentioned above may be applied in the production of the physical quantity sensor 102 shown in FIG. 6. That is to say, this production method can be used in the production of physical quantity sensors containing a lead frame with bending portions 5f formed on the connecting leads 5d for inclining the stage portions 6 and 7.

Figure 11:
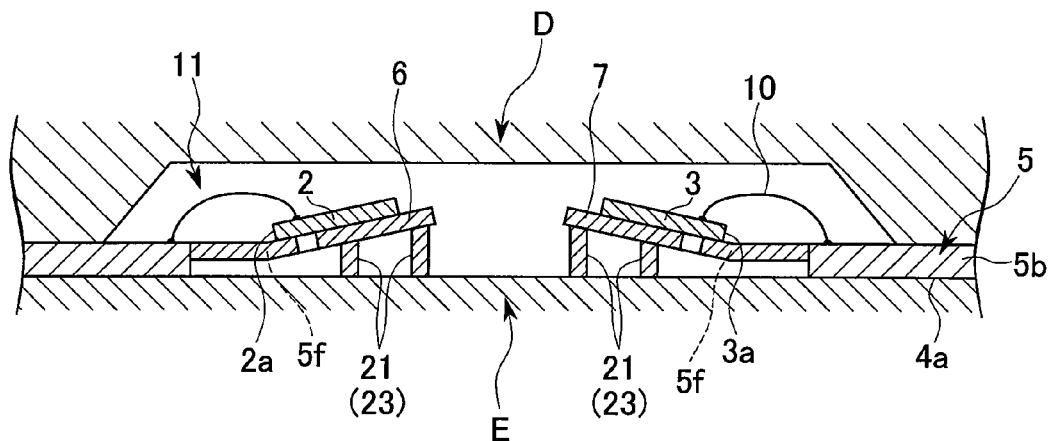
FIG. 11 is a side cross-sectional view showing a method of inclining the stage portion and the physical quantity sensor chip of the physical quantity sensor shown in FIG. 6, in the production method of a physical quantity sensor, according to the second embodiment and the fourth embodiment of the present invention.

In the physical quantity sensor 102 shown in FIG. 6 and FIG. 11, the one end portions 2a and 3a of the physical quantity sensor chips 2 and 3 are fixed to the thinly formed inner sections of the leads 5b. As mentioned above, it is acceptable as long as the leads 5b are in a location relationship such that they are parallel with the bottom face of the one end portions 2a and 3a of the physical quantity sensor chips 2 and 3.

In such a physical quantity sensor 102, as shown in FIG. 11, the bending portions 5f provided on the connecting leads 5d, bend as a result of the plurality of pin-shaped pressing members 21 pressing the stage portions 6 and 7, and as a result of the thinly formed inner sides of the leads 5b also bending together, the stage portions 6 and 7 are inclined.

That is to say, the inclination of the stage portions 6 and 7 resulting from pressing the pressing members 21 is achieved by the bending deformations of the connecting leads 5d and the leads 5b.

Third Embodiment

Next, a third embodiment of this invention is explained with reference to FIG. 1, FIG. 2, FIG. 4, FIG. 5, FIG. 12, and FIG. 13. In the explanation of the present embodiment, the same reference symbols are given to constituents common with the first embodiment, and explanation regarding the details is omitted.

The physical quantity sensor produced by the third embodiment possesses the same configuration as the physical quantity sensor 101 produced by the first embodiment shown in FIG. 1, FIG. 2, FIG. 4, and FIG. 5.

Figure 12:
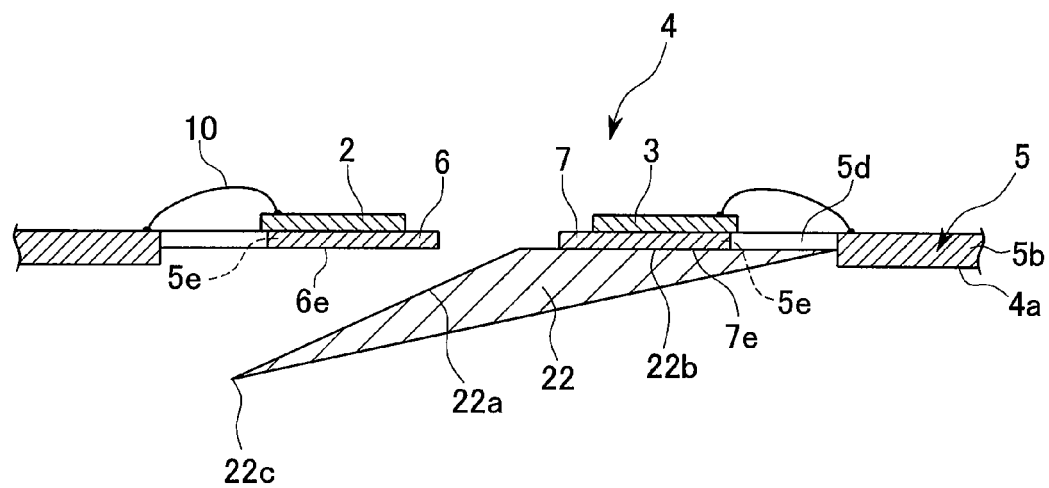
FIG. 12 is a side cross-sectional view showing a state where a pressing member is fixed to the stage portion of the lead frame of the physical quantity sensor shown in FIG. 1, in the production method of a physical quantity sensor, according to the third embodiment of the present invention.

In the production method of the physical quantity sensor 101 according to the third embodiment, after formation of the lead frame 4, one of the inclined surfaces 22b of a pressing member 22 is fixed such that it makes facial contact with the back face 7e of one or other of the stage portions 6 and 7 (in the present embodiment, the stage portion 7), as shown in FIG. 12. At this time, the other inclined surface 22a of the pressing member 22 which is not fixed, is positioned on the underside of the back face 6e of the stage portion 6. The inclined surfaces 22a and 22b of the pressing member 22 possess the same inclination angle as the angle that the respective stage portions 6 and 7 should be inclined.

Figure 13:
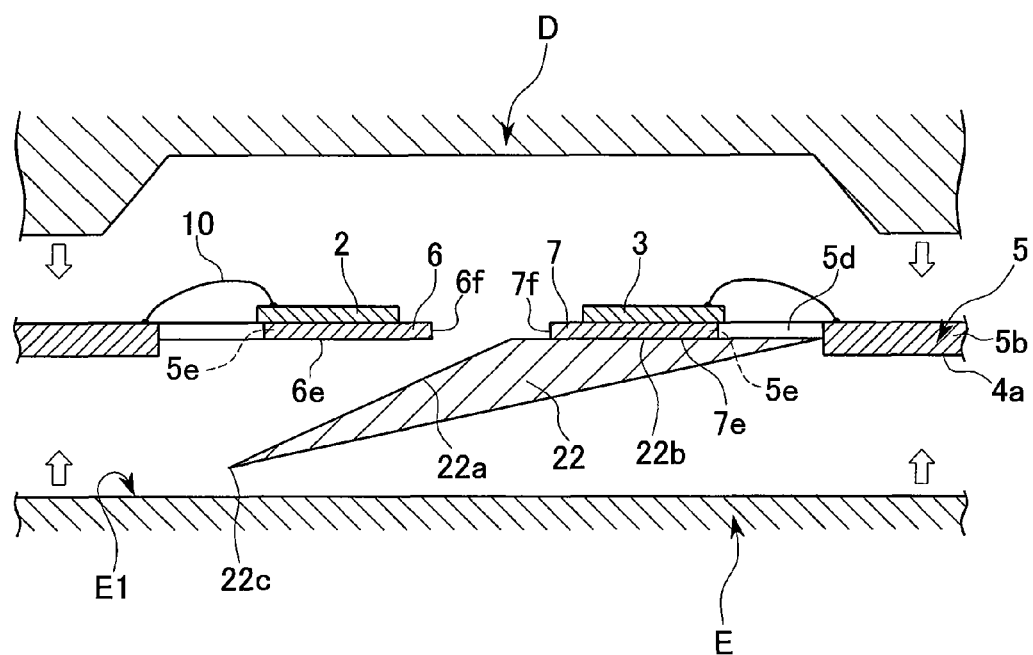
FIG. 13 is a side cross-sectional view showing a method of inclining the stage portion and the physical quantity sensor chip of the physical quantity sensor shown in FIG. 1, in the production method of a physical quantity sensor, according to the third embodiment of the present invention.

Next, as shown in FIG. 13, of the frame portion 5, the rectangular frame portion 5a and the rectangular frame portion 5a proximal section of the leads 5b are fixed and sandwiched by the metallic molds D and E.

The pressing member 22, which is fixed to the stage portion 7, is provided between the stage portions 6 and 7 and the inner face E1 of the metallic mold E. Consequently, at the time of clamping the metallic molds D and E, the end portion 22c of the inclined surface 22a of the pressing member 22, which is not fixed, firstly comes into contact with the inner face E1 of the metallic mold E, and is progressively pressed. The stage portion 7 on the fixed pressing member 22 side begins to incline as a result of deformation of the twisting portion 5e. Furthermore, at the stage where the stage portion 7 on the fixed pressing member 22 side has been inclined to some extent, the end portion 6f of the stage portion 6 is pressed by the unfixed inclined surface 22a of the pressing member 22, and the other stage portion 6 begins to incline. At the point when the clamping of the metallic molds D and E has been completed, the stage portions 6 and 7 have become inclined at a predetermined inclination angle.

As shown in FIG. 4, at the point when the clamping of the metallic molds D and E has been completed, the pressing member 22 maintains the inclined stage portions 6 and 7 at the predetermined inclination angle by making the back faces 6e and 7e of the inclined stage portions 6 and 7 and the inclined surfaces 22a and 22b respectively come into facial contact.

In this state, the melted resin is injected into the interior of the metallic molds D and E, the physical quantity sensor chips 2 and 3 are embedded in the interior of the resin, and the resin mold portion 11 is formed. As a result, the physical quantity sensor chips 2 and 3 are fixed within the resin mold portion 11 in a state where they are mutually inclined. The pressing member 22 is also integrated in the resin mold portion 11 and is fixed.

Furthermore, as shown in FIG. 5, after solidification of the resin and formation of the resin mold portion 11, the metallic molds D and E are removed. Lastly, of the rectangular frame portion 5a and the leads 5b, sections which protrude outside the resin mold portion 11 are cut off, and the production of the physical quantity sensor 101 is completed.

In the production method of the physical quantity sensor 101 mentioned above, the pressing member 22 fixed to one or other of the stage portions 6 and 7 is provided between the stage portions 6 and 7 and the inner face E1 of the metallic mold E. By performing clamping of the metallic molds D and E, this pressing member 22 presses the back faces 6e and 7e of the stage portions 6 and 7, and the stage portions 6 and 7 are inclined at the predetermined inclination angle with certainty.

Furthermore, in the production method of the physical quantity sensor 101 mentioned above, the pressing member 22 comprises the inclined surfaces 22a and 22b, which make facial contact with the back faces 6e and 7e of the inclined stage portions 6 and 7. Accordingly, when the resin is injected into the metallic molds D and E, the stage portions 6 and 7 are maintained with certainty by this pressing member 22, and the stage portions 6 and 7 can be fixed at the predetermined inclination angle without distortion or displacement occurring as a result of the injection of the resin.

Furthermore, in the production method of the physical quantity sensor 101 mentioned above, the pressing member 22 is formed by a metal, and this pressing member 22 is integrated in the resin mold portion 11. Accordingly, it also possesses an advantage in being able to improve the heat dissipation efficiency of the physical quantity sensor 101. The pressing member 22 is, for example, formed from copper or brass.

The pressing member 22 can be made the same material as the pressing member 20 explained in the first embodiment. Furthermore, it is acceptable if, at the very least, the shape of the pressing member 22 possesses the inclined surfaces 22a and 22b as a component, which make facial contact with the back faces 6e and 7e of the stage portions 6 and 7 in the same manner as the pressing member 20.

Moreover, it is acceptable for integration to be performed by pressing the pressing member 22, which is fixed to the stage portion 7, before clamping the metallic molds D and E, thereby inclining the stage portions 6 and 7, and in this state, fixing the unfixed inclined surface 22a of the pressing member 22 to the stage portion 6, and thereafter, performing clamping of the metallic molds D and E, and injecting the resin into the metallic molds D and E.

The production method of the third embodiment mentioned above, in the same manner as the first embodiment, can also be used for the physical quantity sensor shown in FIG. 6, in which bending portions 5f are formed on the connecting leads 5d for inclining the stage portions 6 and 7.

In this physical quantity sensor 101, as shown in FIG. 7, the pressing member 22 is fixed to the bottom face 6e or 7e of one of the stage portions 6 and 7, and the stage portions 6 and 7 are pressed by this pressing member 22 as a result of the clamping of the metallic molds D and E. As a result of this production method, the bending portions 5f provided on the connecting leads 5d bend, and together with this, the thinly formed inner side of the leads 5b also bend, inclining the stage portions 6 and 7.

Fourth Embodiment

Next, a fourth embodiment of this invention is explained with reference to FIG. 1, FIG. 2, FIG. 9, FIG. 10, FIG. 14 and FIG. 15. In the explanation of the present embodiment, the same reference symbols are given to constituents common with the second embodiment, and explanation regarding the details is omitted.

The physical quantity sensor produced by the fourth embodiment possesses the same configuration as the physical quantity sensor 103 produced by the second embodiment shown in FIG. 1, FIG. 2, FIG. 9, and FIG. 10. The difference with the second embodiment is in the point that the pin-shaped pressing members 23 for inclining the stage portions 6 and 7 are installed in fixing holes formed on the bottom faces 6e and 7e of the stage portions 6 and 7.

That is to say, as shown in FIG. 10, a plurality of pin-shaped pressing members 23 are integrated within the resin mold portion 11 between the inclined stage portions 6 and 7 and the bottom face 11a of the resin mold portion 11, which is continuous with the back face 4a of the leads 5b.

These pin-shaped pressing members 23 are formed by a metal, and are positioned in the same locations as the pin-shaped pressing members 21 mentioned above. The one end portions 23a of the respective pin-shaped pressing members 23 are fixed to the stage portions 6 and 7, and the other end portions 23b are positioned on the bottom face 11a of the resin mold portion 11.

When the stage portions 6 and 7 have been inclined at the predetermined inclination angle, the one end portions 23a of the pressing members 23 are fixed to the stage portions 6 and 7 such that the axial centerlines of the pin-shaped pressing members 23 perpendicularly intersect the bottom face 11a of the resin mold portion 11. Furthermore, when the stage portions 6 and 7 have been inclined at the predetermined inclination angle, the other end portions 23b of the pin-shaped pressing members 23 make facial contact with the bottom face 11a of the resin mold portion 11.

Next, the production method of this physical quantity sensor 103 is explained.

The lead frame 4, as shown in FIG. 2, is produced in nearly the same manner as the one used in the first embodiment.

Figure 14:
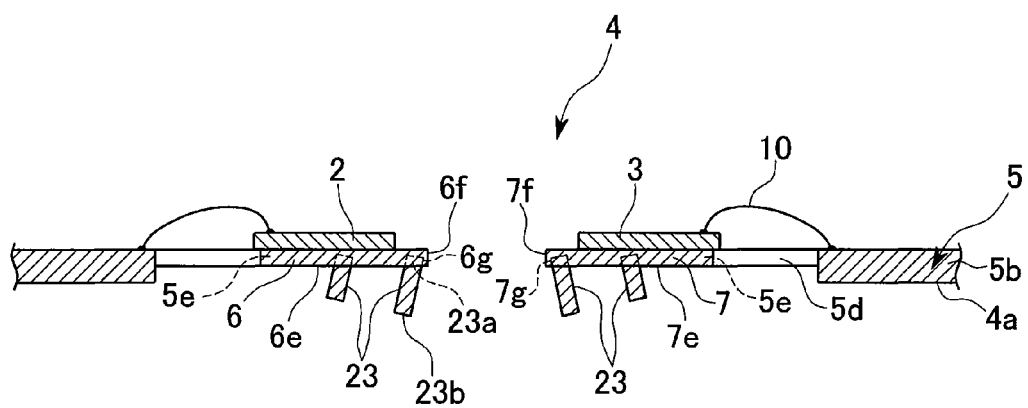
FIG. 14 is a side cross-sectional view showing a state where a pressing member is fixed to the stage portion of the lead frame of the physical quantity sensor shown in FIG. 1, in the production method of a physical quantity sensor, according to the fourth embodiment of the present invention.

However, in the production method of the physical quantity sensor 103 according to the fourth embodiment, as shown in FIG. 14, when the lead frame 4 is formed, the fixing holes 6g and 7g are simultaneously formed in the back faces 7e of the stage portions 6 and 7. After formation of this lead frame 4, the one end portions 23a of the pressing members 23 are engaged in the fixing holes 6g and 7g, and are fixed.

Figure 15:
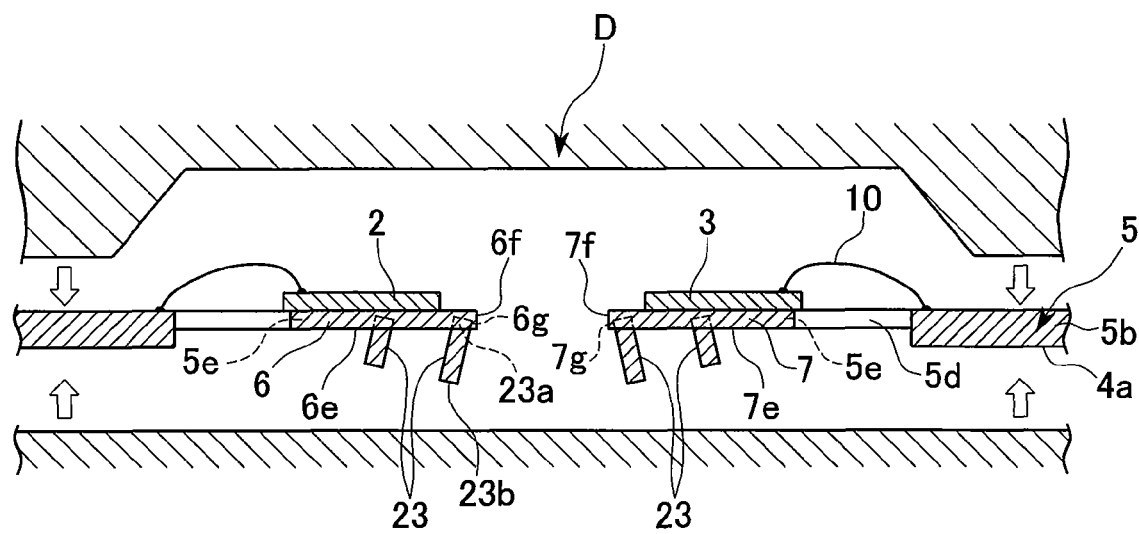
FIG. 15 is a side cross-sectional view showing a method of inclining the stage portion and the physical quantity sensor chip of the physical quantity sensor shown in FIG. 1, in the production method of a physical quantity sensor, according to the fourth embodiment of the present invention.

Next, as shown in FIG. 15, of the frame portion 5, the rectangular frame portion 5a and the rectangular frame portion 5a proximal sections of the leads 5b are fixed and sandwiched by the metallic molds D and E.

At this time, the pin-shaped pressing members 23 fixed to the stage portions 6 and 7 are interposed between the stage portions 6 and 7 and the inner face E1 of the metallic mold E. Consequently, at the time of clamping the metallic molds D and E, of the pressing member 23, the other end portions 23b of the pressing members 23 positioned on the end portions 6f and 7f of the stage portions 6 and 7 are firstly pressed by the inner face E1 of the metallic mold E, and the stage portions 6 and 7 begin to incline as a result of the deformation of the twisting portions 5e. Furthermore, at the stage where the stage portions 6 and 7 have been inclined to some extent, the other end portions 23b of the pressing members 23 positioned near the center of the stage portions 6 and 7 are pressed by the inner face E1 of the metallic mold E, and the stage portions 6 and 7 are further inclined. At the point when the clamping of the metallic molds D and E has been completed, the stage portions 6 and 7 are inclined at the predetermined inclination angle.

As shown in FIG. 9, at the point when the clamping of the metallic molds D and E has been finished, the pressing members 23 maintain the stage portions 6 and 7 at the predetermined inclination angle as a result of the facial contact between the other end portions 23b and the inner face E1 of the metallic mold E.

In this state, the melted resin is injected into the metallic molds D and E, the physical quantity sensor chips 2 and 3 are embedded in the interior of the resin, and the resin mold portion 11 is formed. As a result, as shown in FIG. 10, the physical quantity sensor chips 2 and 3 are fixed within the resin mold portion 11 in a state where they are mutually inclined. The pin-shaped pressing members 23 are also integrated in the resin mold portion 11, and are fixed.

Furthermore, as shown in FIG. 10, after solidification of the resin and formation of the resin mold portion 11, the metallic molds D and E are removed. Finally, of the leads 5b, sections which protrude outside the resin mold portion 11 are cut off together with the rectangular frame portion 5a, and the production of the physical quantity sensor 103 is completed.

In the production method of the physical quantity sensor 103 mentioned above, the same effects as the production method of the second embodiment can be obtained.

Furthermore, in the same manner as the second embodiment, the pressing members 23 are, for example, formed from copper or brass, and possess a length which forms the predetermined inclination angle of the stage portions. Furthermore, the pressing members 23 may be disposed anywhere as long as they are in a position where it is possible to press the back faces 6e and 7e of the stage portions 6 and 7 with certainty. Moreover, the shape of the other end portions 23b of the pin-shaped pressing members 23 may be, for example, a spherical shape, a hemispherical shape or a pointed shape.

Furthermore, the one end portions 23a of the pressing members 23 may be fixed to the stage portions 6 and 7 such that the axial centerlines of the pin-shaped pressing members 23 perpendicularly intersect the back faces 6e and 7e of the stage portions 6 and 7. That is to say, there are no restrictions on the angle formed by the back faces 6e and 7e of the stage portions 6 and 7 and the axial centerlines of the pin-shaped pressing members 23.

As structures for fixing the one end portions 23a of the pressing members 23 to the back faces 6e and 7e of the stage portions 6 and 7, other than the structure mentioned above, there are the structures shown from FIG. 16A to FIG. 16E.

Figure 16A:
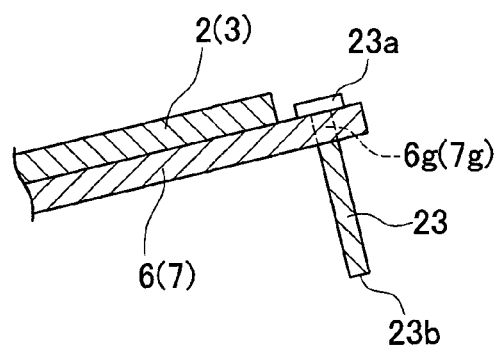
FIG. 16A is a cross-sectional view showing the shape, and the fixation method to the stage portion, of the pressing member, in the production method of a physical quantity sensor, according to the fourth embodiment of the present invention.
Figure 16B:
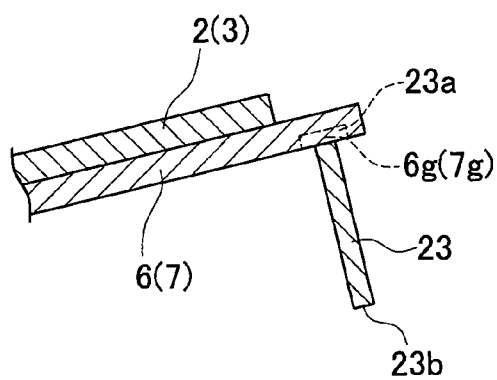
FIG. 16B is a cross-sectional view showing the shape, and the fixation method to the stage portion, of the pressing member, in the production method of a physical quantity sensor, according to the fourth embodiment of the present invention.

That is to say, the fixing holes 6g and 7g formed in the stage portions may, as shown in FIG. 16A and FIG. 16B, be formed such that they pass through, or be formed such that they do not pass through the stage portions 6 and 7. The method of fixing the one end portions 23a of the pin-shaped pressing members to these fixing holes 6g and 7g is not restricted to an engagement method, and methods which bond with an adhesive, or methods which fix as a result of welding, may be used as alone, or as a combination.

Figure 16C:
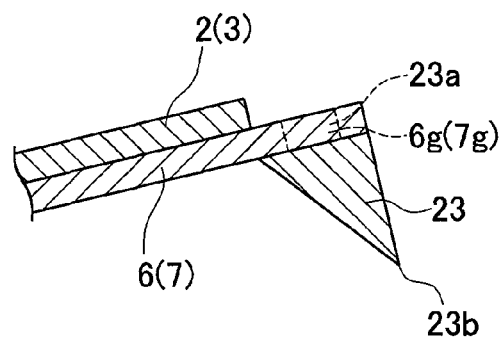
FIG. 16C is a cross-sectional view showing the shape, and the fixation method to the stage portion, of the pressing member, in the production method of a physical quantity sensor, according to the fourth embodiment of the present invention.

Furthermore, the pressing members 23 may be formed by a resin, and in this case, the shape of the pressing members 23 may be made, for example, as shown in FIG. 16C, a shape other than a pin.

Figure 16D:
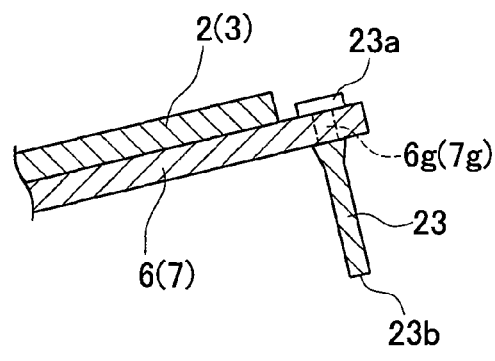
FIG. 16D is a cross-sectional view showing the shape, and the fixation method to the stage portion, of the pressing member, in the production method of a physical quantity sensor, according to the fourth embodiment of the present invention.
Figure 16E:
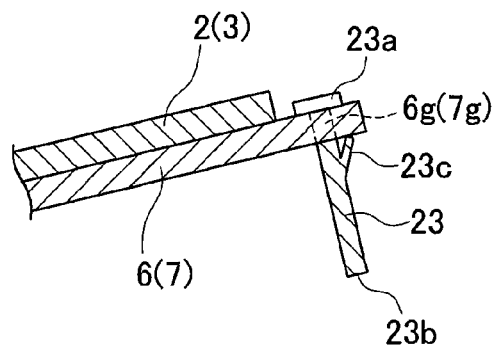
FIG. 16E is a cross-sectional view showing the shape, and the fixation method to the stage portion, of the pressing member, in the production method of a physical quantity sensor, according to the fourth embodiment of the present invention.

Moreover, regarding the pressing members 23, for example, as shown from FIG. 16C to FIG. 16E, end portions 23a of the pressing members 23 may possess a larger cross-sectional area than the fixing holes 6g and 7g. Furthermore, as shown in FIG. 16E, protrusions 23c may be formed on at least a portion of the pressing members. According to these configurations, it is difficult for the pressing members 23 to be displaced with respect to pressing by the inner face E1 of the metallic mold E, and the pressing force can be imparted on the stage portions 6 and 7 more efficiently.

The production method of this fourth embodiment can, in the same manner as the second embodiment, be used in the production of the physical quantity sensor shown in FIG. 6.

In this case, as shown in FIG. 11, the bending portions 5f provided on the connecting leads 5d, bend as a result of the plurality of pin-shaped pressing members 21 pressing the stage portions 6 and 7, and as a result of the thinly formed inner sides of the leads 5b also bending together, the stage portions 6 and 7 are inclined.

Fifth Embodiment

Next, a fifth embodiment of this invention is explained with reference to FIG. 17 to FIG. 20. In the explanation of the present embodiment, the same reference symbols are given to constituents common with the aforementioned embodiments, and detailed explanation is omitted.

The physical quantity sensor 104 produced by the fifth embodiment is produced using the lead frame shown in FIG. 2 mentioned above, and has the same configuration as the magnetic sensor shown in FIG. 1.

Figure 17:
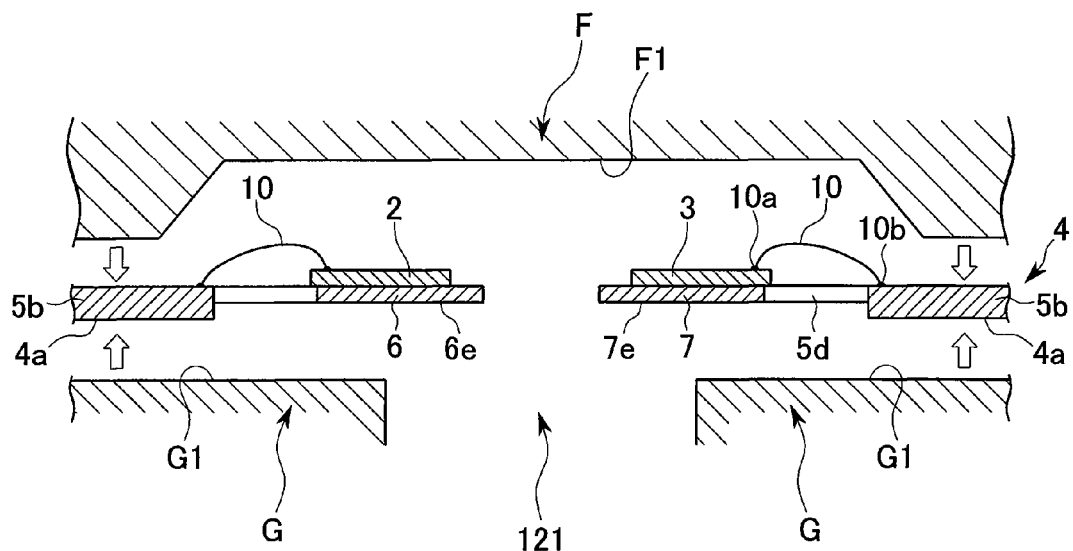
FIG. 17 is a side cross-sectional view showing a method of inclining the stage portion and the physical quantity sensor chip of the physical quantity sensor shown in FIG. 1, in a production method of a physical quantity sensor, according to a fifth embodiment of the present invention.

In the production method of the physical quantity sensor 104 according to the fifth embodiment, in the same manner as the embodiments mentioned above, the physical quantity sensor chips 2 and 3 are bonded to the lead frame 4, and are each electrically connected by the wires 10. Next, as shown in FIG. 17, of the frame portion 5, the rectangular frame portion 5a and the rectangular frame portion 5a proximal section of the leads 5b are fixed and sandwiched by the metallic molds F and G.

An aperture portion 121 for inserting a jig 120 mentioned below is provided in the metallic mold G. The inner face G1, excluding the aperture portion 121 of the metallic mold G, is planar, such that it tightly contacts the rectangular frame portion 5a and the back faces 4a of the leads 5b.

Figure 18:
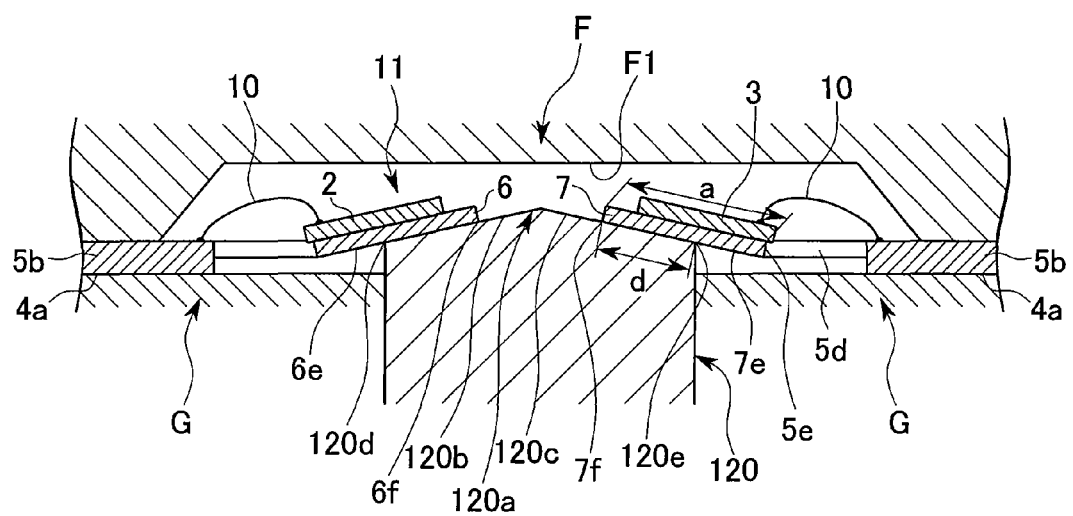
FIG. 18 is a drawing showing a method of inclining the stage portion and the physical quantity sensor chip of the physical quantity sensor shown in FIG. 1, in the production method of a physical quantity sensor, according to the fifth embodiment of the present invention.

Next, as shown in FIG. 18, the jig 120, serving as the pressing member, is inserted into the aperture portion 121 of the metallic mold G. At this time, an end portion 120a of the jig 120 presses the back faces 6e and 7e of the stage portions 6 and 7, and together with this, the stage portions 6 and 7 gradually incline. As a result of the jig 120 being inserted by only a fixed insertion amount from the aperture portion 121, the stage portions 6 and 7 are inclined at the predetermined inclination angle.

Inclined surfaces 120b and 120c, which make facial contact with the plane formed when the back faces 6e and 7e of the stage portions 6 and 7 are inclined at a predetermined inclination angle, are formed on the end portions 120a of the jig 120.

If the distance from the straight line connecting the two twisting portions 5e of the stage portions 6 and 7 to the end portions 6f and 7f of the stage portions 6 and 7 is denoted by "a", and the distance from the side end portions 120d and 120e of the inclined surfaces 120b and 120c which make facial contact with the back faces 6e and 7e of the stage portions 6 and 7 to the end portions 6f and 7f of the stage portions 6 and 7 which make facial contact is denoted by "d", then the distance "d" is formed such that it becomes from 30% to 70% of the distance "a". A distance "d" of approximately 50% of the distance "a" is more preferable.

At the stage where the insertion of the jig 120 has been completed such that the stage portions 6 and 7 become the predetermined inclination angle, the jig 120 is fixed. At this time, the inclined surfaces 120b and 120c provided on the end portion 120a of the jig 120, and the back faces 6e and 7e of the inclined stage portions 6 and 7 respectively make facial contact, and since the jig 120 is supporting the stage portions 6 and 7, the stage portions 6 and 7 are maintained at the predetermined inclination angle. This predetermined inclination angle is set to an angle at which the azimuth and the orientation of the external magnetic field can be reliably detected by the physical quantity sensor 104.

In the state where the jig 120 is inserted into the metallic molds F and G, the melted resin is injected into the metallic molds F and G, the physical quantity sensor chips 2 and 3 are embedded in the interior of the resin, and the resin mold portion 11 is formed. As a result, the physical quantity sensor chips 2 and 3 are fixed within the resin mold portion 11 in a state where they are mutually inclined.

Figure 19:
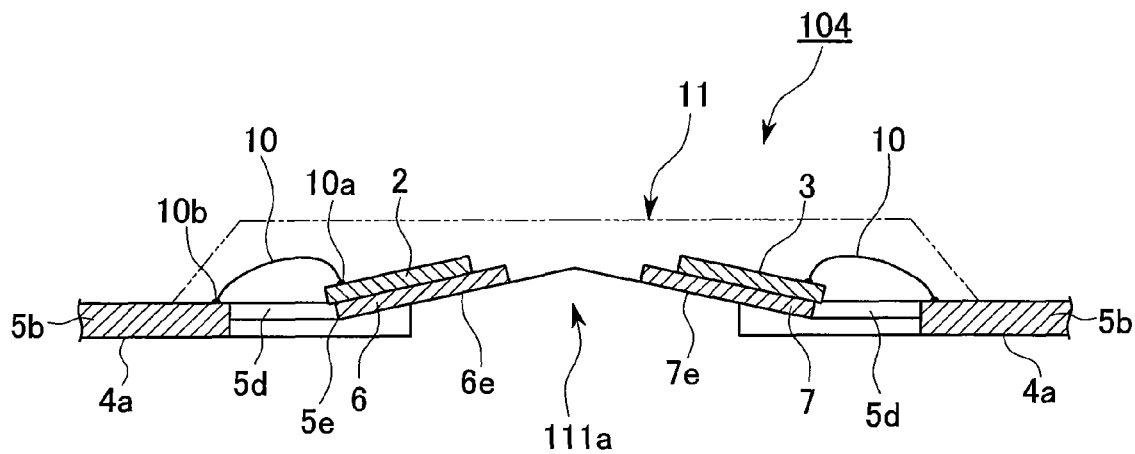
FIG. 19 is a side cross-sectional view showing a physical quantity sensor produced by the production method according to the fifth embodiment of the present invention.

Next, as shown in FIG. 19, after solidification of the resin and formation of the resin mold portion 11, the jig 120 and the metallic molds F and G are removed. At this time, a concave portion 111a, which exhibits the shape of the inserted jig 120, is formed in the resin mold portion 11.

Figure 20:
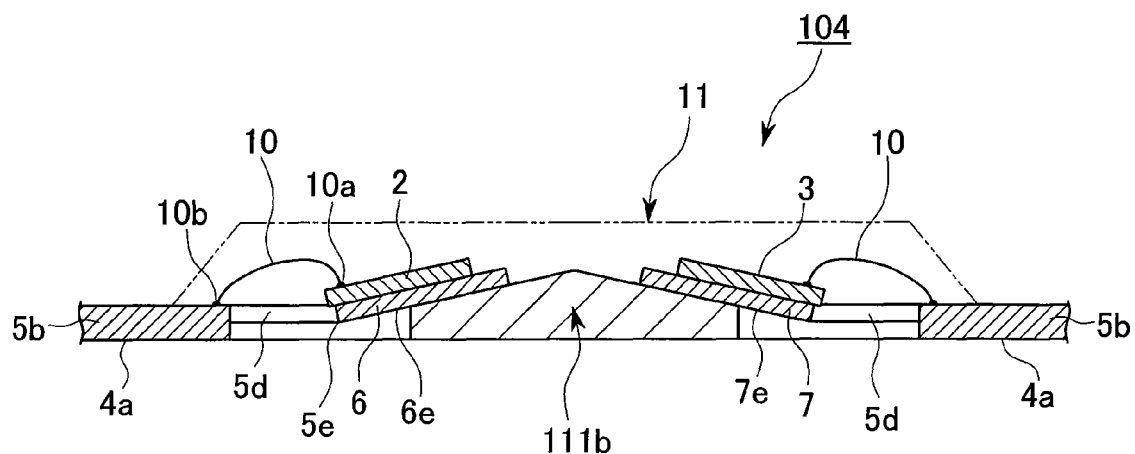
FIG. 20 is a side cross-sectional view showing a physical quantity sensor produced by the production method according to the fifth embodiment of the present invention.

Furthermore, as shown in FIG. 20, a filling material is filled into the concave portion 111a formed in the resin mold portion 11. At this time, as the filling material 111b with a shape which fits the concave portion 111a, in the case where the heat dissipating efficiency of the physical quantity sensor 104 is to be improved, a filling material 111b with a high thermal conductivity is filled. For example, a heat sink comprising copper or brass is filled, or a resin mixed with a high heat dissipating resin or a metal can be filled by a method for punching in the concave portion 111a. In the case where there is no necessity to improve the heat dissipating efficiency of the physical quantity sensor 104, the same resin as the resin mold portion 11 is filled.

Finally, of the leads 5b, sections which protrude outside the resin mold portion 11 are cut off together with the rectangular frame portion 5a, and the production of the physical quantity sensor 104 is completed.

In the production method of the physical quantity sensor 104 of the fifth embodiment, since the stage portions 6 and 7 are inclined by pressing the jig 120 against the stage portions 6 and 7, the stage portions can be appropriately inclined with the simple operation of inserting the jig 120 by a fixed amount.

Furthermore, in the production method of this physical quantity sensor 104, the jig 120 has the inclined surfaces 120b and 120c, and these surfaces make respective facial contact with the flat surfaces 6e and 7e formed by the back faces 6e and 7e of the inclined stage portions 6 and 7. Accordingly, when the resin is injected into the metallic molds F and G, the stage portions 6 and 7 are maintained with certainty, and the stage portions 6 and 7 can be fixed at the predetermined inclination angle without distortion or displacement occurring as a result of the injection of the resin.

Furthermore, in the production method of this physical quantity sensor 104, a desired filling material can be selectively filled into the concave portion 111a of the resin mold portion 11 formed by removing the jig 120. In the case where the heat dissipating efficiency of the physical quantity sensor 104 is to be improved, a filling material with a high thermal conductivity can be filled, and in the case where there is no necessity to improve the heat dissipating efficiency of the physical quantity sensor 104, the same resin as the resin mold portion 11 can be filled.

The present invention is one which is not limited to the fifth embodiment mentioned above, and appropriate changes are possible within a range which does not depart from the gist thereof. For example, although it was made so that the filling material was filled into the concave portion 111a of the resin mold portion 11 which was formed by removing the jig 120, it is not necessarily restricted to this. It is acceptable for the concave portion 111a formed in this resin mold portion 11 to remain as a vacant space.

The production method of the fifth embodiment mentioned above can be used in the production of the physical quantity sensor shown in FIG. 6. That is to say, it can be used in the production of physical sensors containing a lead frame in which bending portions 5f are formed on the connecting leads 5d in order to incline the stage portions 6 and 7.

Figure 21A:
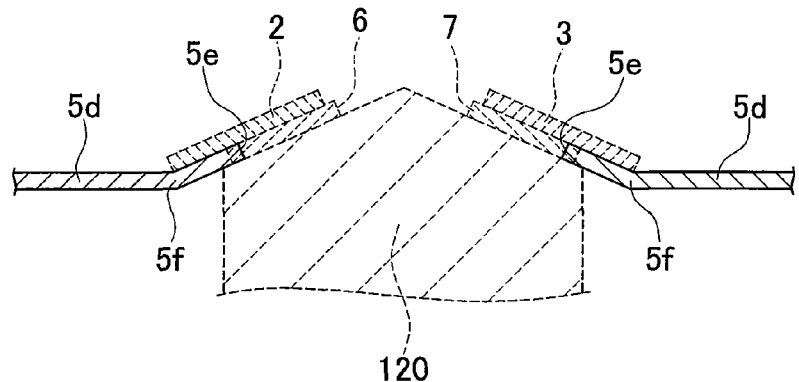
FIG. 21A is a view along the arrows A-A in FIG. 6, showing a method of inclining the stage portion and the physical quantity sensor chip of the physical quantity sensor shown in FIG. 6, in the production method of a physical quantity sensor, according to the fifth embodiment of the present invention.
Figure 21B:
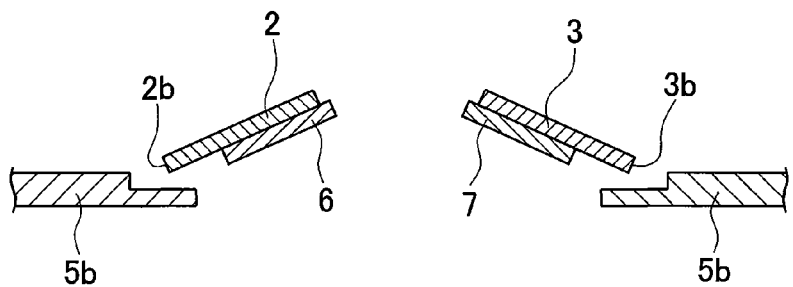
FIG. 21B is a view along the arrows B-B in FIG. 6, showing a method of inclining the stage portion and the physical quantity sensor chip of the physical quantity sensor shown in FIG. 6, in the production method of a physical quantity sensor, according to the fifth embodiment of the present invention.

As shown in FIG. 21A and FIG. 21B, the stage portions 6 and 7 of this physical quantity sensor are inclined as a result the bending portions 5f provided on the connecting leads 5d, bending by being pressed by the jig 120. In a case where the one end portions 2a and 3a of the physical quantity sensor chips 2 and 3 are positioned such that they are separated from the inner side upper portions of the leads 5b, when the stage portions 6 and 7 incline, the one end portions 2a and 3a of the physical quantity sensor chips 2 and 3 become nearer to the leads 5b. However, since the inner sections of the leads 5b are formed thinly, as shown in FIG. 21B, the physical quantity sensor chips 2 and 3 do not come into contact with the leads 5b.

Sixth Embodiment

Next, a sixth embodiment of this invention is explained with reference to FIG. 1, FIG. 2, and FIG. 22. In the explanation of the present embodiment, the same reference symbols are given to constituents common with the embodiments mentioned above, and explanation regarding the details is omitted.

As shown from FIG. 22 to FIG. 25, the physical quantity sensor 105 produced by the sixth embodiment has, of the lead frame 4 shown in FIG. 2 mentioned above, the concave portions 122b and 123b, which engage with the jig 124 when the stage portions 122 and 123 are inclined at a predetermined inclination angle, formed in the back faces 122a and 123a of the stage portions 122 and 123.

Figure 22:
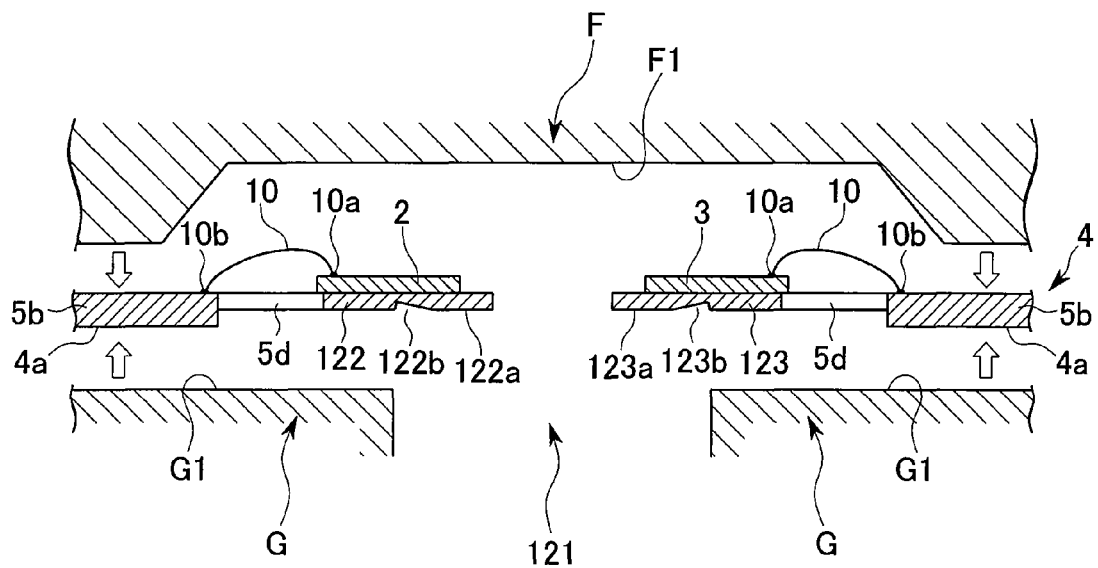
FIG. 22 is a side cross-sectional view showing a method of inclining the stage portion and the physical quantity sensor chip of the physical quantity sensor shown in FIG. 1, in a production method of a physical quantity sensor, according to a sixth embodiment of the present invention.

As shown in FIG. 22, in the production method of the physical quantity sensor according to the sixth embodiment, in the same manner as the embodiments mentioned above, the physical quantity sensor chips 2 and 3 are bonded to the lead frame 4, and are each electrically connected by wires 10. Next, of the frame portion 5 of the lead frame 4, the rectangular frame portion 5a and the rectangular frame portion 5a proximal section of the leads 5b are fixed and sandwiched by the metallic molds F and G.

An aperture portion 121 for inserting a jig 124 is provided in the metallic mold G. The inner face G1, excluding the aperture portion 121, is planar, such that it closely contacts the rectangular frame portion 5a and the back faces 4a of the leads 5b.

Figure 23:
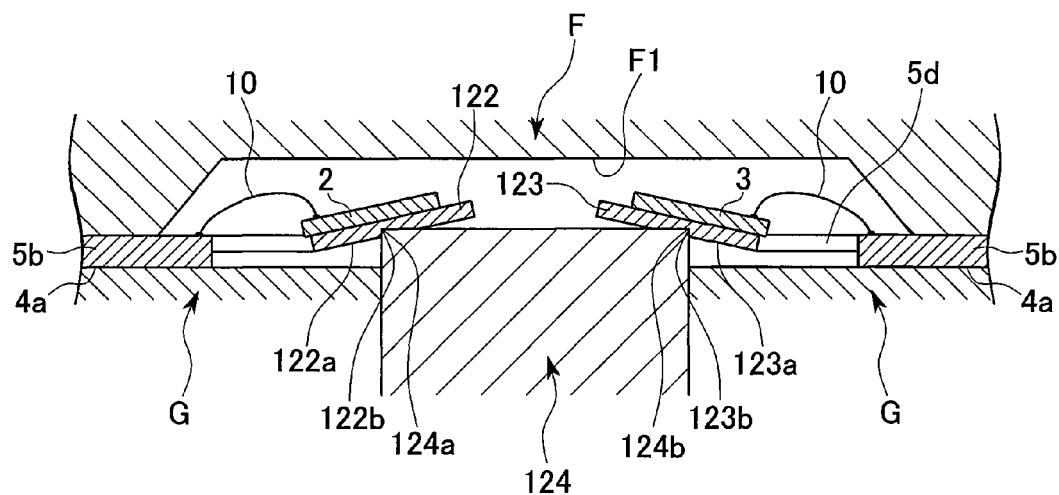
FIG. 23 is a side cross-sectional view showing a method of inclining the stage portion and the physical quantity sensor chip of the physical quantity sensor shown in FIG. 1, in the production method of a physical quantity sensor, according to the sixth embodiment of the present invention.

Next, as shown in FIG. 23, the jig 124, serving as the pressing member, is inserted into the aperture portion 121 of the metallic mold G. Both end portions 124a and 124b of the end of the jig 124 engage the respective concave portions 122b and 123b, and press the back faces 122a and 123a of the stage portions 122 and 123. As a result, the jig 124 gradually inclines the stage portions 122 and 123. The stage portions 122 and 123 incline at a predetermined inclination angle as a result of the jig 124 being inserted by only a fixed insertion amount. As shown in FIG. 23, the concave portions 122b and 123b formed in the back faces 122a and 123a of the stage portions 122 and 123 engage both end portions 124a and 124b of the jig 124, and the stage portions 122 and 123 are maintained at the predetermined inclination angle.

Next, in this state, the melted resin is injected into the metallic molds F and G, the physical quantity sensor chips 2 and 3 are embedded in the interior of the resin, and the resin mold portion 11 is formed. As a result, the physical quantity sensor chips 2 and 3 are fixed within the resin mold portion 11 in a state where they are mutually inclined.

Figure 24:
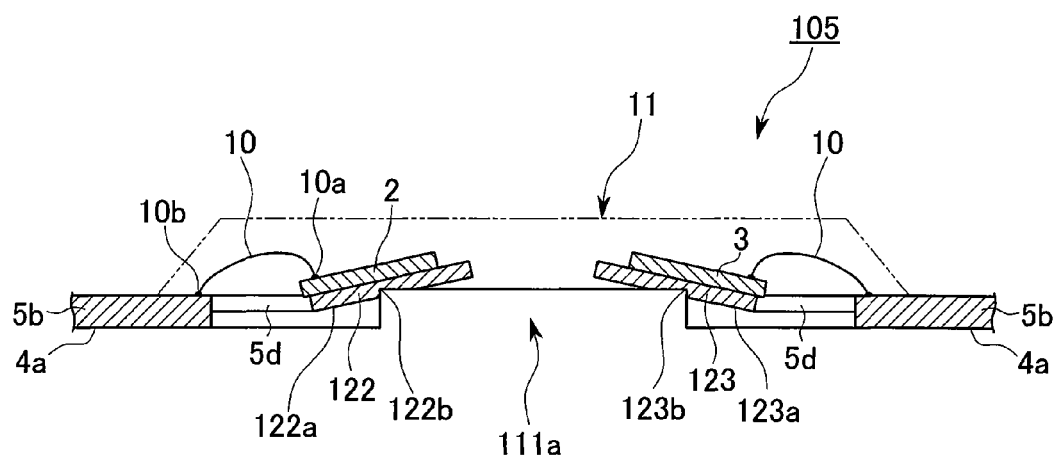
FIG. 24 is a cross-sectional view showing a physical quantity sensor produced by the production method according to the sixth embodiment of the present invention.

As shown in FIG. 24, after solidification of the resin and formation of the resin mold portion 11, the jig 124 and the metallic molds F and G are removed. At this time, a concave portion 111a, which exhibits the shape of the inserted jig 124, is formed in the resin mold portion 11.

Figure 25:
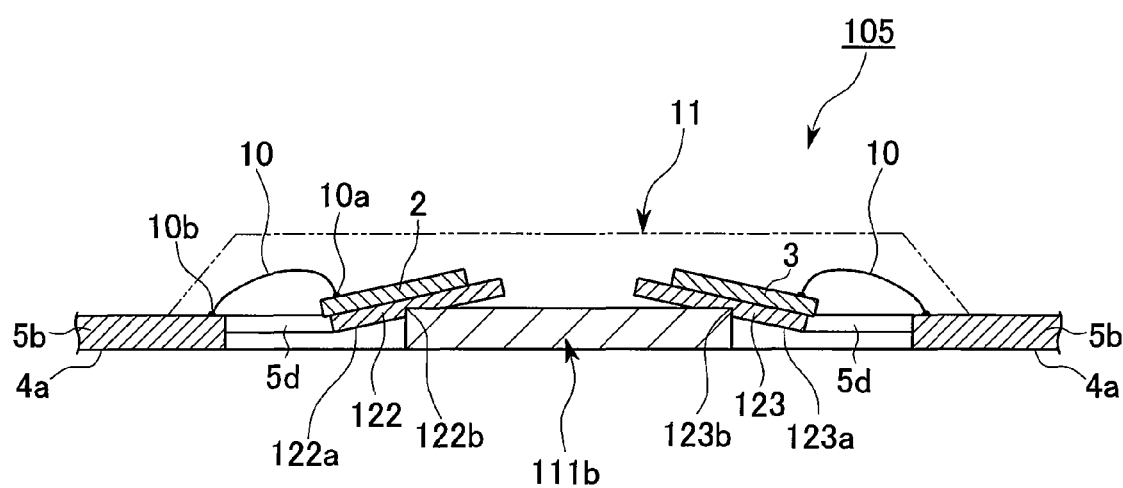
FIG. 25 is a cross-sectional view showing a physical quantity sensor produced by the production method according to the sixth embodiment of the present invention.
Figure 26:
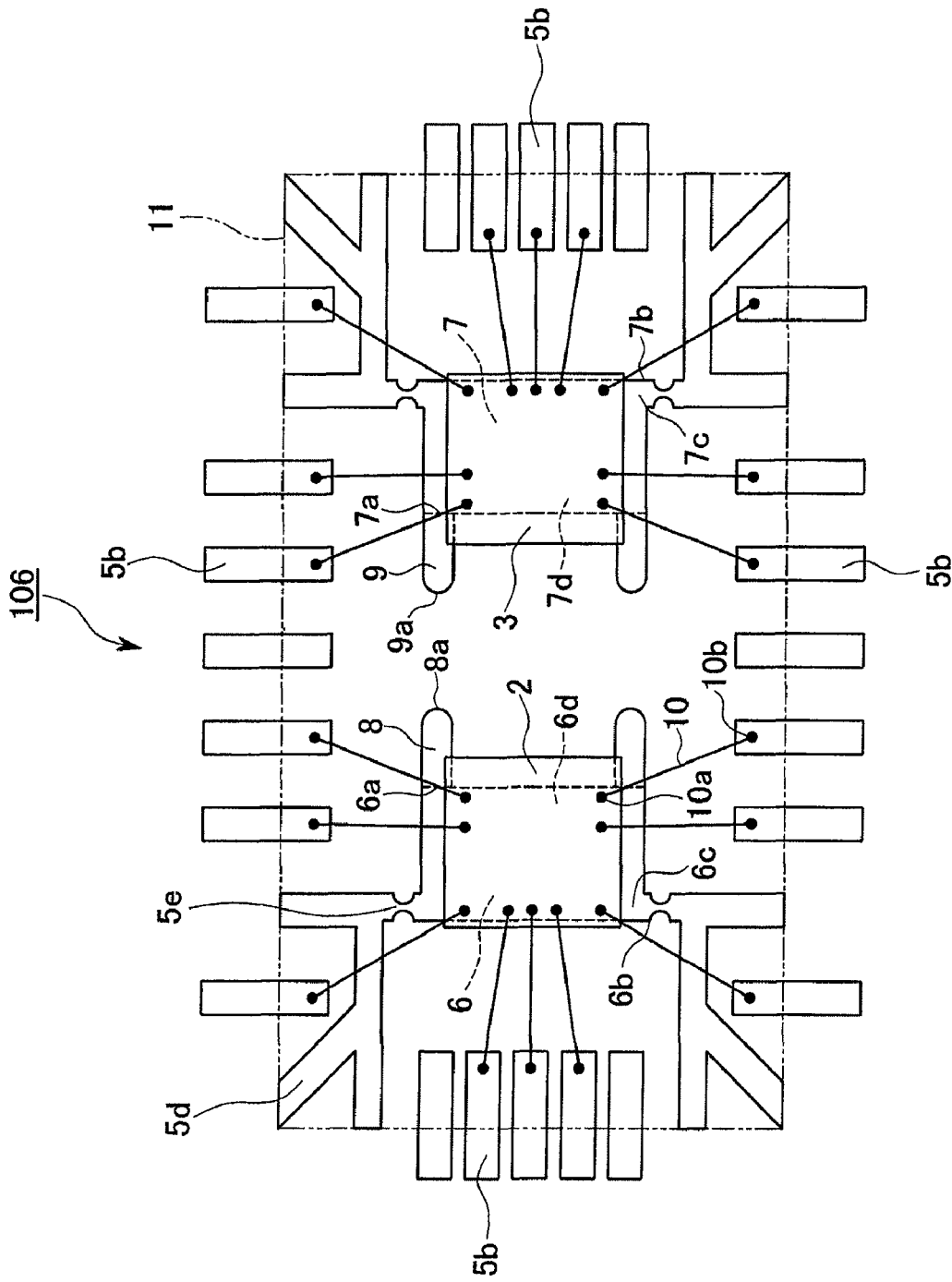
FIG. 26 is a plan view showing a physical quantity sensor produced by a conventional production method.
Figure 27:
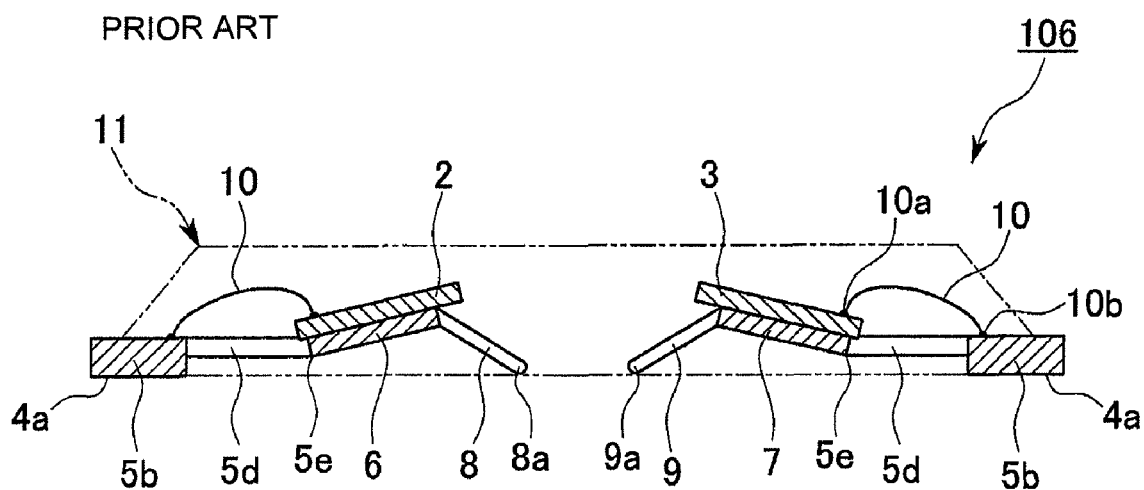
FIG. 27 is a side cross-sectional view showing the conventional physical quantity sensor shown in FIG. 26.

Next, as shown in FIG. 25, the filling material, which has the same shape as this concave portion 111a, is filled into the concave portion 11a of the resin mold portion 11. At this time, in the case the heat dissipating efficiency of the physical quantity sensor 105 is to be improved, a filling material with a high thermal conductivity is filled. For example, a heat sink comprising copper or brass is filled, or a resin mixed with a high heat dissipating resin or a metal can be filled by a punching-in method. In the case where there is no necessity to improve the heat dissipating efficiency of the physical quantity sensor 105, the same resin as the resin mold portion 11 is filled.

Finally, the leads 5b and the sections of the connecting leads 5d which protrude outside the resin mold portion 11 are cut off together with the rectangular frame portion 5a, and the production of the physical quantity sensor 105 is completed.

According to the production method of the sixth embodiment, the same effects as the effects which can be obtained from the production method of the fifth embodiment can be obtained.

Furthermore, in the production method of the sixth embodiment, the concave portions 122b and 123b, which engage both end portions 124a and 124b of the end of the jig 124, are formed in the back faces 122a and 123a of the stage portions 122 and 123. Accordingly, when the resin is injected into the metallic molds F and G, the stage portion 122 and 123 are maintained with more certainty, and the stage portions 122 and 123 can be fixed at the predetermined inclination angle without distortion or displacement occurring as a result of the injection of the resin.

In the sixth embodiment mentioned above, although it was made so that the concave portions 122b and 123b, which engage both end portions 124a and 124b of the end of the jig 124, were formed on the back faces 122a and 123a of the stage portions 122 and 123, it is not necessarily restricted to this. That is, convex portions which engage the jig 124 may be formed on the back faces 122a and 123a of the stage portions 122 and 123. Furthermore, the part of the jig 124 which engages this concave portion or convex portion is not restricted to both end portions 124a and 124b of the end.

Moreover, the concave portion 111a of the resin mold portion 11 formed as a result of removing the jig 124 may be kept as is, without filling with a filling material Above, although the embodiments of the present invention were explained in detail with reference to the drawings, the specific configuration is in no way restricted by these embodiments, and design changes are possible within a range that does not depart from the scope of the present invention.

INDUSTRIAL APPLICABILITY

The present invention is able to be applied to production methods of physical quantity sensors which measure the azimuth and orientation of physical quantities, such as magnetism and gravity, and is able to perform inclination of the physical quantity sensor chips included in such physical quantity sensors with accuracy and certainty.

The invention claimed is:

1. A method for manufacturing a physical quantity sensor, comprising:
    preparing a lead frame which includes a rectangular frame portion, a plurality of leads protruding out from said rectangular frame portion in the inward direction, and a plurality of stages that are connected to the rectangular frame portion by connecting leads;
    fixing at least one physical quantity sensor chip to at least one of said stages;
    inclining said stages and said at least one physical quantity sensor chip with respect to said rectangular frame portion;
    integrating said at least one physical quantity sensor chip, said stages and said leads within a mold using a resin; and
    wherein the act of inclining said stages and said at least one physical quantity sensor chip with respect to said rectangular frame portion is carried out during the integrating act by simultaneously pressing a back face of each of said stages by a pressing member, wherein said pressing member is a single pressing member and includes inclined surfaces which respectively make facial contact with at least a part of each of said back faces of said stages, and said back faces of said stages are respectively pressed by one of said inclined surfaces so that the stages are inclined.

2. The method for manufacturing a physical quantity sensor according to claim 1, further comprising the acts of:
    providing said pressing member separate from said stage portion between said back face of said stage portion and an inner face of said mold; and
    moving said mold by clamping said mold so that said pressing member presses said back faces of said stages.

3. The method for manufacturing a physical quantity sensor according to claim 1, wherein said pressing member is fixed to at least one stage between said back face of said at least one stage and an inner face of said mold, said pressing member pressing said back face of said at least one stage by movement of said mold caused by clamping of said mold.

4. The method for manufacturing a physical quantity sensor according to claim 1, wherein said pressing member is a jig inserted into an aperture portion of said mold, said method further comprising the steps of:
    clamping said mold;

wherein the act of inclining comprises pressing said jig against said stages to thereby incline said at least one physical quantity sensor chip, and wherein said at least one physical quantity sensor chip is held to be inclined by the jig during the act of integrating said at least one physical quantity sensor chip and said leads using said resin.

5. The method for manufacturing a physical quantity sensor according to claim 4, further comprising the step of, after solidification of said resin, removing said jig and filling a filling material into a concave portion of said solidified resin formed by said jig.

6. The method for manufacturing a physical quantity sensor according to claim 4, wherein a concave portion or a convex portion which engages with at least a part of said jig is formed on said at least one stage.

\* \* \* \* \*